United States Patent [19]
Takekuma et al.

[11] Patent Number: 5,441,834
[45] Date of Patent: Aug. 15, 1995

[54] PROCESS FOR FABRICATING PHASE SHIFT MASK AND PROCESS OF SEMICONDUCTOR INTEGRATED CIRCUIT DEVICE

[75] Inventors: Toshitsugu Takekuma, Ohme; Ii: Haruo, Akishima; Kazuya Ito, Hamura, all of Japan

[73] Assignees: Hatachi, Ltd.; Hatachi VLSI Engineering Corp., Tokyo, Japan

[21] Appl. No.: 943,002

[22] Filed: Sep. 10, 1992

[30] Foreign Application Priority Data

Jul. 20, 1992 [JP] Japan .................................. 4-192019

[51] Int. Cl.⁶ .............................................. G03F 9/00
[52] U.S. Cl. ...................................... 430/5; 364/489;
364/490; 250/491.1; 250/492.2; 382/144
[58] Field of Search .................. 430/5; 364/489, 490;
250/491.1, 492.2; 382/8, 10, 30

[56] References Cited

U.S. PATENT DOCUMENTS 5,045,417  9/1991  Okamoto .................................. 430/5
5,278,816  1/1994  Russell .................................. 369/100

OTHER PUBLICATIONS

Hirai, et al "Automatic Pattern Generation System for Phase Shifting Mask" in Digest of Technical Papers-1991 Symposium on VLSI Technology, pp. 95 and 96.

*Primary Examiner*—Mark A. Chapman
*Attorney, Agent, or Firm*—Antonelli, Terry, Stout & Kraus

[57] ABSTRACT

When the data of a mask pattern of a phase shift mask is to be made, the pattern data is separated into a real pattern data layer having the data of real patterns and a phase shift pattern data layer having the data of phase shift patterns. After this, it is verified whether or not the mask pattern satisfies the regulation of the gap of in-phase patterns, in which lights having transmitted through patterns adjacent to each other are in phase. It is also verified whether or not the mask pattern satisfies the regulation of the gap of out-of-phase patterns, in which lights having transmitted through patterns adjacent to each other are out of phase.

18 Claims, 22 Drawing Sheets

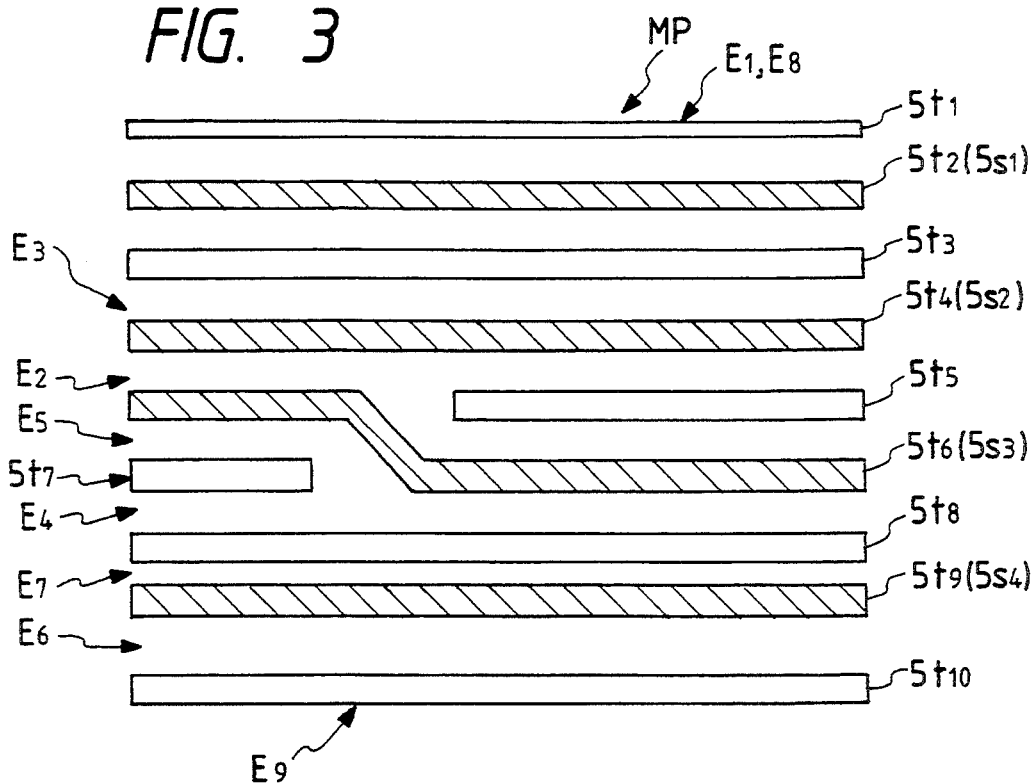
MP : MASK PATTERN
5t1~5t10 : REAL PATTERNS
5s1~5s4 : PHASE SHIFT PATTERNS
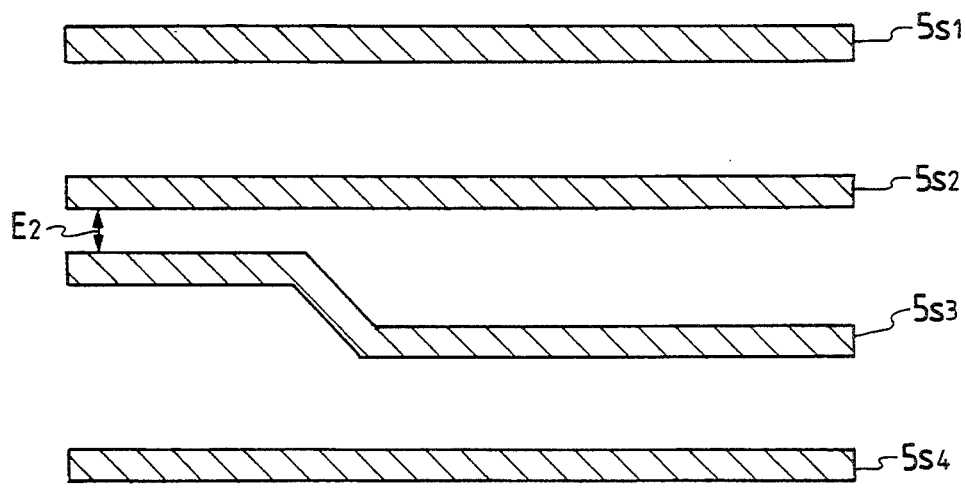

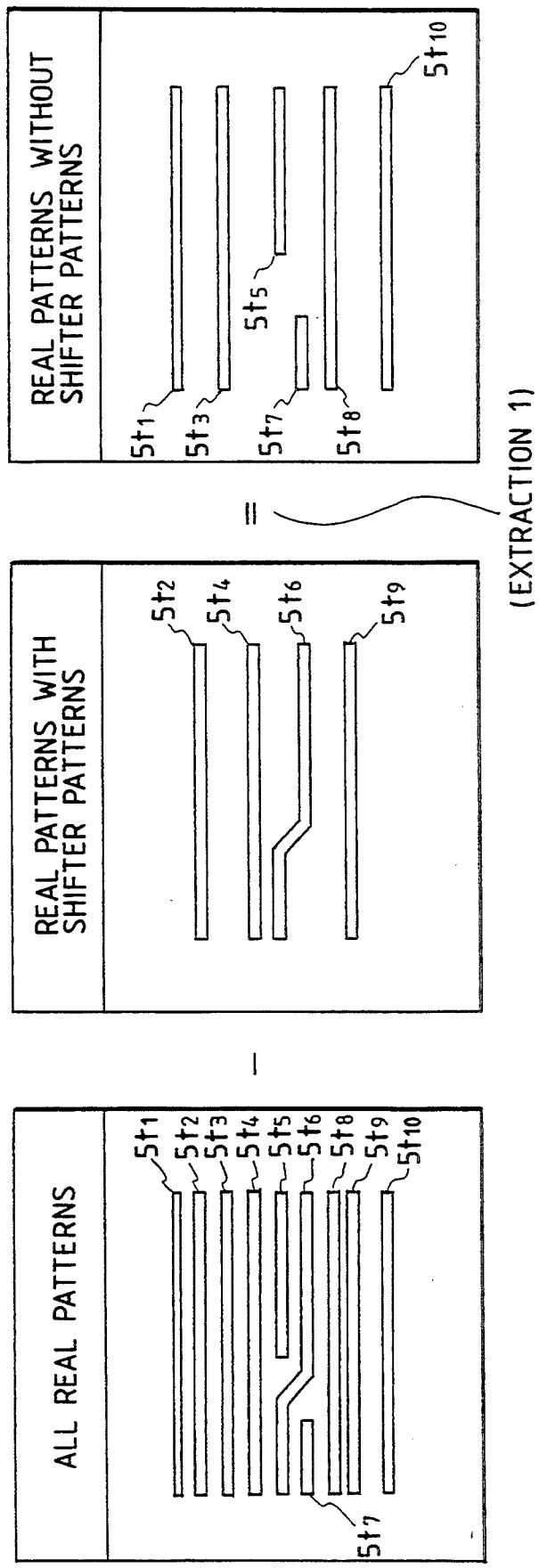

6 : PHASE SHIFT MASK
7 : MASK SUBSTRATE
8a~8d : SHIELDING FILMS
9a, 9b : PHASE SHIFT FILMS

FIG. 17

VERIFICATION 1

- 100: LAY OUT ALL HOLE PATTERNS USING PHASE SHIFT METHOD WITH HOLE PATTERN CELLS
- 101: REPLACE HOLE PATTERN CELLS OF MASK PATTERN BY VACANT CELLS
- 102: EXTRACT ISOLATED AUXILIARY PATTERNS ISOLATED SHIFTER PATTERNS AND ISOLATED REAL PATTERNS

FIG. 18

VERIFICATION 2

- 100: LAY OUT ALL HOLE PATTERNS USING PHASE SHIFT METHOD WITH HOLE PATTERN CELLS
- 101: PEPLACE THE HOLE PATTERN CELLS BY VERIFYING CELLS
- 102: CHECK POSITIONS AND ORDERS OF ARRANGEMENT OF THE VERIFYING CELLS
- 103: (EXTRACTION 1) EXTRACT OVERLAPPED CELLS BETWEEN THE VERIFYING CELLS
- 104: (EXTRACTION 2) EXTRACT PATTERNS HAVING ONE AUXILIARY PATTERN BETWEEN REAL PATTERNS FROM PATTERNS OBTAINED BY EXTRACTION 1
- 105: ELIMINATE PATTERNS OBTAINED BY EXTRACTION 2, FROM PATTERNS OBTAINED BY EXTRACTION 1

FIG. 23

| HOLE PATTERN CELL $C_1$ | VERIFYING CELL $C_1$ | HOLE PATTERN CELL $C_8$ | VERIFYING CELL $C_8$ |
|---|---|---|---|
| HOLE PATTERN CELL $C_2$ | VERIFYING CELL $C_2$ | HOLE PATTERN CELL $C_9$ | VERIFYING CELL $C_9$ |
| HOLE PATTERN CELL $C_3$ | VERIFYING CELL $C_3$ | HOLE PATTERN CELL $C_{10}$ | VERIFYING CELL $C_{10}$ |
| HOLE PATTERN CELL $C_4$ | VERIFYING CELL $C_4$ | HOLE PATTERN CELL $C_{12}$ | VERIFYING CELL $C_{12}$ |
| HOLE PATTERN CELL $C_5$ | VERIFYING CELL $C_5$ | HOLE PATTERN CELL $C_{11}$ | VERIFYING CELL $C_{11}$ |
| HOLE PATTERN CELL $C_6$ | VERIFYING CELL $C_6$ | HOLE PATTERN CELL $C_{14}$ | VERIFYING CELL $C_{14}$ |
| HOLE PATTERN CELL $C_7$ | VERIFYING CELL $C_7$ | HOLE PATTERN CELL $C_{13}$ | VERIFYING CELL $C_{13}$ |

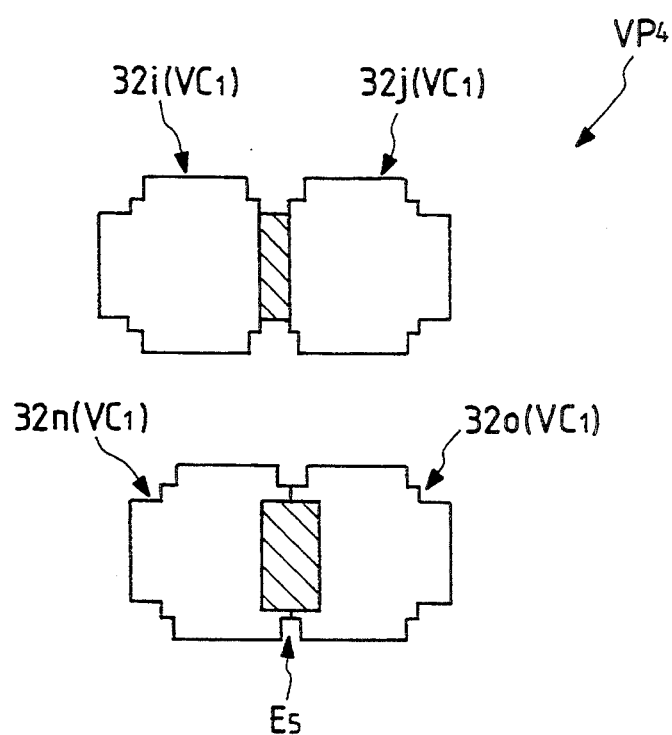

PROCESS FOR FABRICATING PHASE SHIFT MASK AND PROCESS OF SEMICONDUCTOR INTEGRATED CIRCUIT DEVICE

BACKGROUND OF THE INVENTION

The present invention relates to an exposure technology and, more particularly, to a technology which is effective if applied to a technology for fabricating a phase shift mask to be used in an exposure step or one step of a process for fabricating a semiconductor integrated circuit device and a semiconductor integrated circuit pattern transfer technology using the phase shift mask fabricating technology.

In the photolithography step of transferring a circuit pattern on a photo mask by using a light of g-th line or i-th line, there arises a limit to the minimum working size of a pattern to be excellently transferred, as the degree of integration of the elements of a semiconductor integrated circuit device increases.

As a method of reducing the minimum working size of the pattern, it is conceivable to shorten the wavelength of the light used for the exposure. But, various problems practically arise in the shortening of the wavelength of the light. As a method of improving a resolution with the wavelength being held as it is, there is another technology for increasing the numerical aperture (NA) of an optical system in an exposure apparatus.

In accordance with the use of a light of short wavelength and the improvement in the NA, however, there arises a problem that the focal depth becomes extremely shallow. In recent years, therefore, various exposure technologies for improving the resolution while retaining the focal depth have been examined and are represented by a phase shifting method.

The phase shifting method is a technology for preventing the contrast of a projected image from degrading by changing the phase of the light to transmit through a photo mask.

The phase shifting technology is disclosed in Japanese Patent Laid-Open No. 173744/1983, for example. Here, there is disclosed a phase shifting technology (of Levenson type), in which a transparent film is disposed on one of a pair of transparent areas interposing a shielding area, to establish a phase difference between the lights having transmitted through the two transparent areas at the time of exposure so that the interfering lights may be weakened in the portion which is the intrinsic shielding area on a semiconductor wafer.

In Japanese Patent Laid-Open No. 67514/1987, for example, on the other hand, there is disclosed a phase shifting technology (of auxiliary shifter type). According to this technology, after a fine aperture pattern has been formed in a portion of a shielding area on a photo mask, a transparent film is disposed either in the aperture pattern or in a transparent area close to the aperture pattern, to establish a phase difference between the light having transmitted through the aperture pattern and the light having transmitted through the transparent area close to the aperture pattern, thereby to prevent the amplitude distribution of the light having transmitted through the transparent area from being transversely spread.

PROBELMS TO BE SOLVED BY THE INVENTION

In the aforementioned phase shifting technologies of the prior art, however, a real semiconductor integrated circuit pattern and a pattern formed over the phase shift mask may be partially overlapped. Therefore, we have found a problem that it is impossible to verify the propriety of the pattern of the phase shift mask when the data of the mask pattern is to be made.

The present invention has been conceived by noting the above-specified problem and has an object to provide a technology capable of verifying the propriety of the pattern of a phase shift mask.

Another object of the present invention is to provide a technology capable of providing a highly reliable semiconductor integrated circuit device having a fine pattern.

The aforementioned and other objects and novel features of the present invention will become apparent from the following description to be made with reference to the accompanying drawings.

The summaries of the representatives of the invention to be disclosed herein and other summaries will be briefly itemized in the following.

According to a first aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying the propriety of the data of the real patterns having said phase shift patterns arranged thereon, by using the data of said phase shift patterns; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a second aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying the propriety of the data of the real patterns having said phase shift patterns arranged thereon, by using the data of said phase shift patterns; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a third aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying the propriety of the data of the real patterns having none of said phase shift patterns; the step of repeating a verification and a correction till the result of said verification becomes good; the step of making shielding patterns drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a fourth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying the propriety of the data of the real patterns having none of said phase shift patterns; the step of repeating a verification and a correction till the result of said verification becomes good; the step of making a shielding pattern drawing data and a phase shift pattern drawing data individually on the basis of the data of the real patterns, which are formed at the step of making The data of said mask pattern, and the data of said phase shift patterns; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a fifth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying the propriety of the data of the real patterns having none of said phase shift patterns; the step of verifying the propriety of the data of the real patterns having said phase shift patterns arranged thereon, by using the data of said phase shift patterns; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a sixth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying the propriety of the data of the real patterns having none of said phase shift patterns; the step of verifying the propriety of the data of the real patterns having said phase shift patterns arranged thereon, by using the data of said phase shift patterns; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a seventh aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying whether or not the gap between and the width of the real patterns having the phase shift patterns arranged thereon and the real patterns having none of said phase shift patterns are suited for regulated values, by using said phase shift patterns and said real patterns having no phase shift pattern; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to an eighth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of real patterns having no phase shift pattern arranged thereon; the step of verifying whether or not the gap between and the width of the real patterns having the phase shift patterns arranged thereon and the real patterns having none of said phase shift patterns are suited for regulated values, by using said phase shift patterns and said real patterns having no phase shift pattern; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a ninth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not said phase shift patterns are precisely coincident to the corresponding real patterns; the step of repeating a verification and a correction till the result of said verification becomes coincident; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a tenth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not said phase shift patterns are precisely coincident to the corresponding real patterns; the step of repeating a verification and a correction till the result of said verification becomes coincident; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to an eleventh aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of making data of hole patterns by using hole pattern cells prepared in advance; the step of replacing the hole pattern cells for forming said hole patterns by vacant cells having no hole pattern data; the step of verifying the existence and propriety of the patterns remaining after said replacing step; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; and the step of forming said phase shift patterns on said mask substrate on the basis of said phase shift pattern drawing data.

According to a twelfth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of making data of hole patterns by using hole pattern cells prepared in advance; the step of replacing the hole pattern cells for forming said hole patterns by vacant cells having no hole pattern data; the step of verifying the existence and propriety of the patterns remaining after said replacing step; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a thirteenth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of making data of hole patterns by using hole pattern cells prepared in advance; the step of replacing the hole pattern cells for forming said hole patterns by verifying cells; the step of verifying the propriety of the relations among said verifying cells; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; and the step of forming said phase shift patterns on said mask substrate on the basis of said phase shift pattern drawing data.

According to a fourteenth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of making data of hole patterns by using hole pattern cells prepared in advance; the step of replacing the hole pattern cells for forming said hole patterns by verifying cells; the step of verifying the propriety of the relations among said verifying cells; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a fifteenth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of executing different verifications of the data of wiring patterns and the data of hole patterns of the data of said mask pattern; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; and the step of forming said phase shift patterns on said mask substrate on the basis of said phase shift pattern drawing data.

According to a sixteenth aspect of the present invention, there is provided a process for fabricating a semiconductor integrated circuit device, comprising: the step of separating the data of a mask pattern of a phase shift mask having phase shift patterns, when the data of said mask pattern is to be made on a mask substrate, into a real pattern data layer having the data of real patterns, an auxiliary pattern data layer having the data of auxiliary patterns, and a phase shift pattern data layer having the data of said phase shift patterns; the step of executing different verifications of the data of wiring patterns and the data of hole patterns of the data of said mask pattern; the step of repeating a verification and a correction till the result of said verification becomes good; the step of making a shielding pattern drawing data on the basis of the data of the real patterns, which are formed at the step of making the data of said mask pattern, and the data of said auxiliary patterns; the step of making a phase shift pattern drawing data on the basis of the data of the phase shift patterns, which are made at the step of making the data of said mask pattern; the step of forming shielding patterns on said mask substrate on the basis of said shielding pattern drawing data; the step of forming said phase shift patterns on said mask substrate on the basis of said phase shift pattern drawing data; and the step of transferring a predetermined semiconductor integrated circuit pattern to a resist film on the surface of a semiconductor wafer by using said phase shift mask having said shielding patterns and said phase shift patterns.

According to a seventeenth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not the data of said mask pattern satisfies the regulation of the gap of in-phase patterns, in which individual lights having transmitted through patterns adjacent to each other are in phase; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to an eighteenth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying the propriety of the gap between the adjacent patterns of real patterns having phase shift patterns arranged thereon, by verifying the gap of the adjacent patterns of said phase shift pattern; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a nineteenth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of eliminating the real patterns having the phase shift patterns arranged thereon from the data of said mask pattern by using the data of said phase shift patterns, to make the data of the real patterns having no phase shift pattern arranged thereon; the step of verifying the propriety of the gap of the adjacent patterns of the real patterns having none of said phase shift patterns; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a twentieth aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not the data of said mask pattern satisfies the regulation of the width of in-phase patterns, in which individual lights having transmitted through patterns adjacent to each other are in phase; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a twentyfirst aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not the data of said mask pattern satisfies the regulation of the gap and width of in-phase patterns, in which individual lights having transmitted through patterns adjacent to each other are in phase; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a twentysecond aspect of the present Invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not the data of said mask pattern satisfies the regulation of the gap of out-of-phase patterns, in which individual lights having transmitted through patterns adjacent to each other are out of phase; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to a twentythird aspect of the present invention, there is provided a process for fabricating a phase shift mask, comprising: the step of separating the data of a mask pattern of a phase shift mask having phase shift patterns, when the data of said mask pattern is to be made on a mask substrate, into a real pattern data layer having the data of real patterns and a phase shift pattern data layer having the data of said phase shift patterns; the step of verifying whether or not the patterns of the data of said mask pattern for forming a one-side isolated wiring and a two-side isolated wiring satisfy the regulation of the pattern width regulated by said one-side isolated wiring and said two-side isolated wiring; the step of repeating a verification and a correction till the result of said verification becomes good; the step of making a shielding pattern drawing data and a phase shift pattern drawing data individually on the basis of the data of the real patterns, which are formed at the step of making the data of said mask pattern, and the data of said phase shift patterns; the step of forming shielding patterns on said mask substrate on the basis of said shielding pattern drawing data; and the step of forming said phase shift patterns on said mask substrate on the basis of said phase shift pattern drawing data.

According to the above-specified means, the data of the mask pattern of the phase shift mask can be verified and corrected to make the data of the correct mask pattern of the phase shift mask.

By transferring a predetermined semiconductor integrated circuit pattern to a photoresist film on the surface of a semiconductor wafer by the use of the phase shift mask which is prepared by using the data of that correct mask pattern, moreover, it is possible to fabricate a highly reliable semiconductor integrated circuit device which has a fine pattern.

BRIEF DESCRIPTION OF THE DRAWINGS

FIG. 3 is a top plan view showing an example of the mask pattern;

FIG. 5 is a top plan view showing the phase shift patterns, being verified, of the mask pattern of FIG. 3;

FIG. 6 is a diagram for describing the step of extracting real patterns having no phase shift pattern arranged;

FIG. 17 is a flow chart for describing the step of verifying a mask pattern of a phase shift mask according to another embodiment of the present invention;

FIG. 18 is a flow chart for describing the steps of verifying a mask pattern of a phase shift mask according to another embodiment of the present invention;

FIG. 23 is a top plan view showing verifying cells made by using the connection hole cells of FIG. 19;

FIG. 26 is a top plan view showing a pattern from which overlapped ones of adjacent verifying cells are extracted.

DETAILED DESCRIPTION OF THE INVENTION

Embodiment 1

Figure 1:
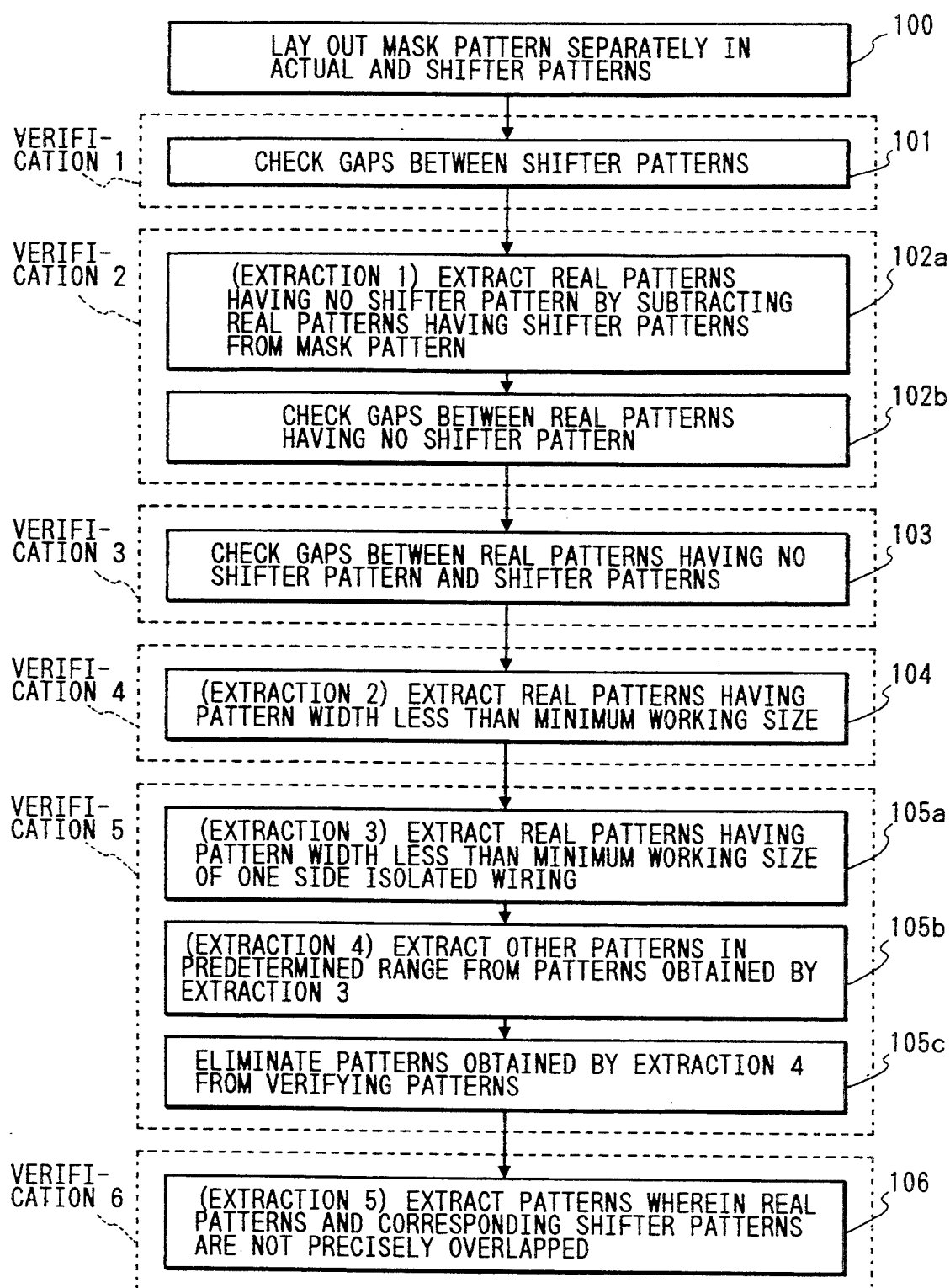
FIG. 1 is a flow chart for describing the steps of verifying a mask pattern of a phase shift mask according to one embodiment of the present invention.
Figure 2:
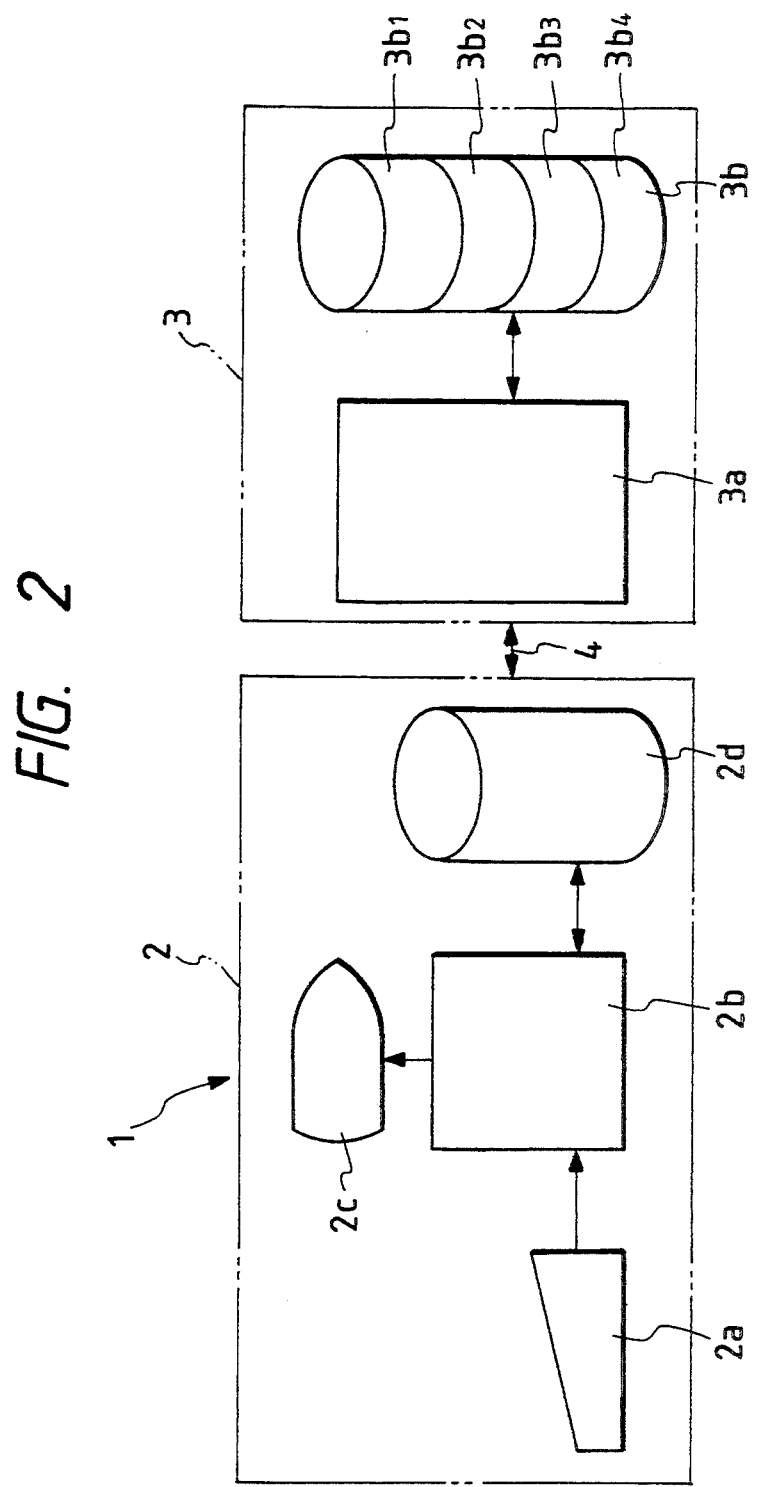
FIG. 2 is a diagram for describing a pattern data making system to be used for making the data of the mask pattern of the phase shift mask.
Figure 4:
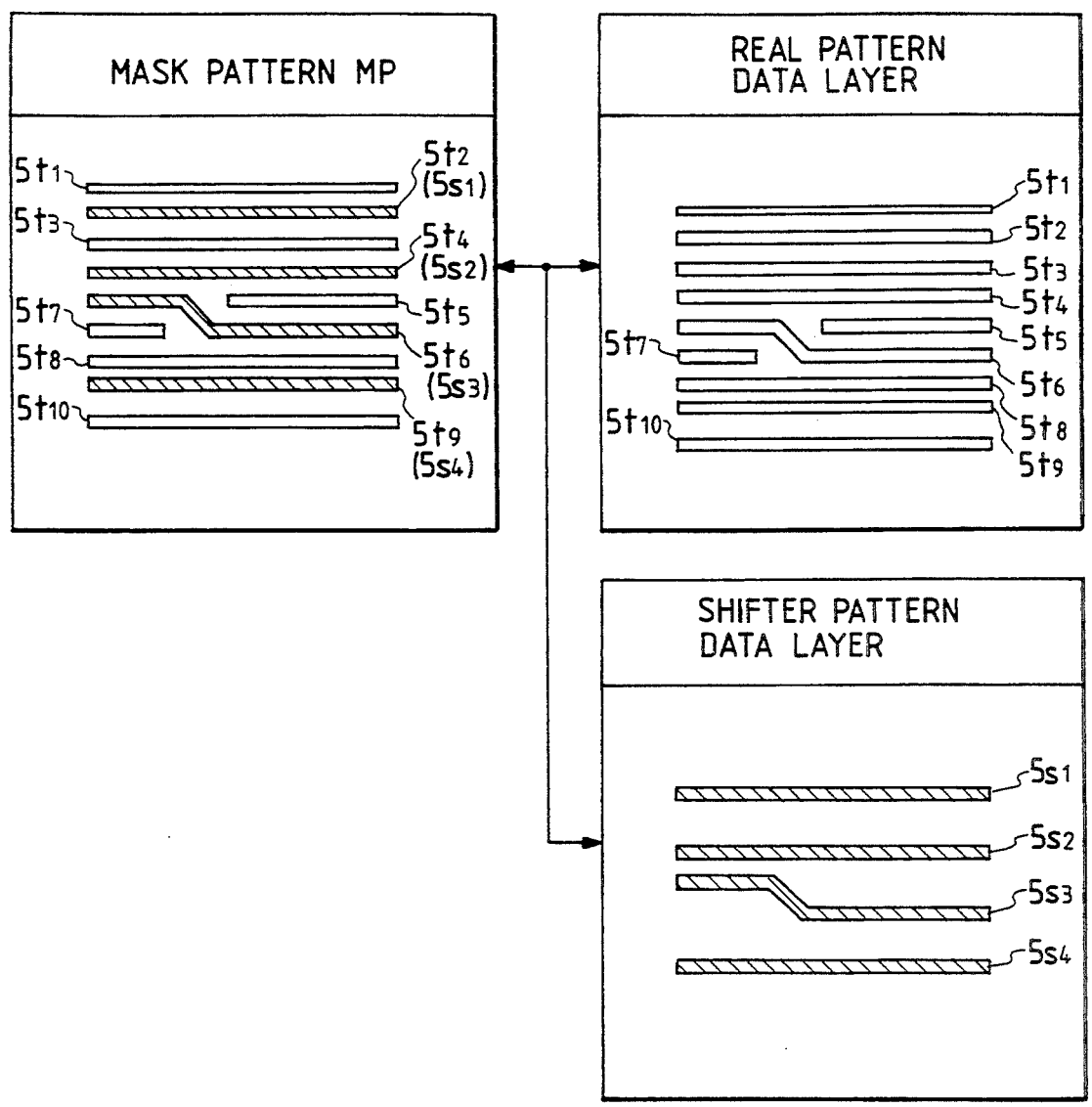
FIG. 4 is a diagram for describing the step of separating the mask pattern of FIG. 3.
Figure 7:
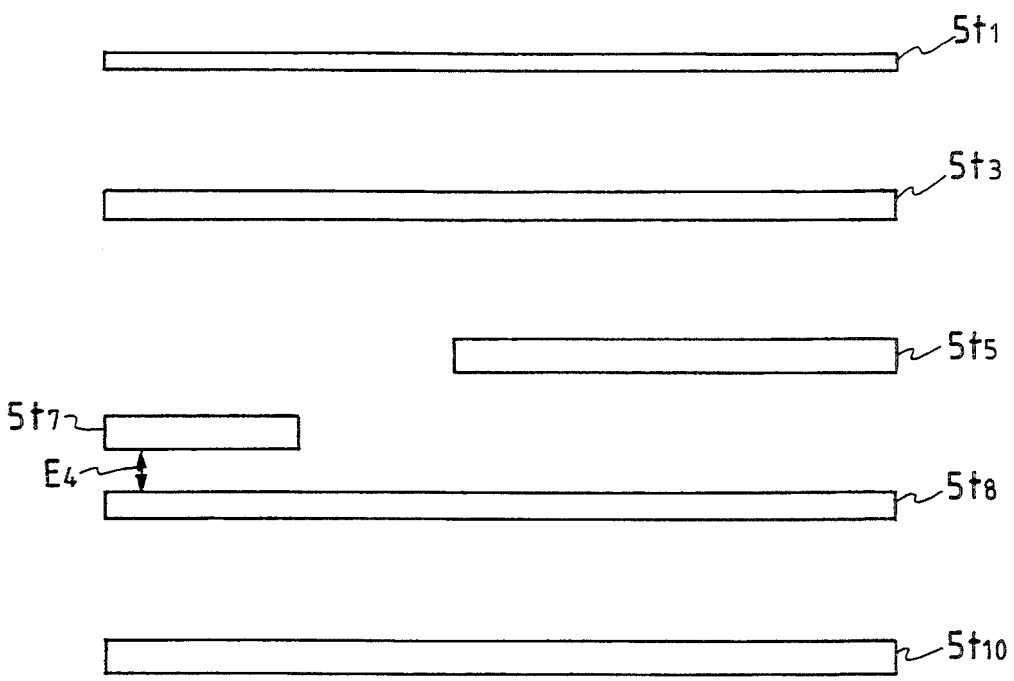
FIG. 7 is a top plan view showing real patterns having no phase shift pattern arranged.
Figure 9:
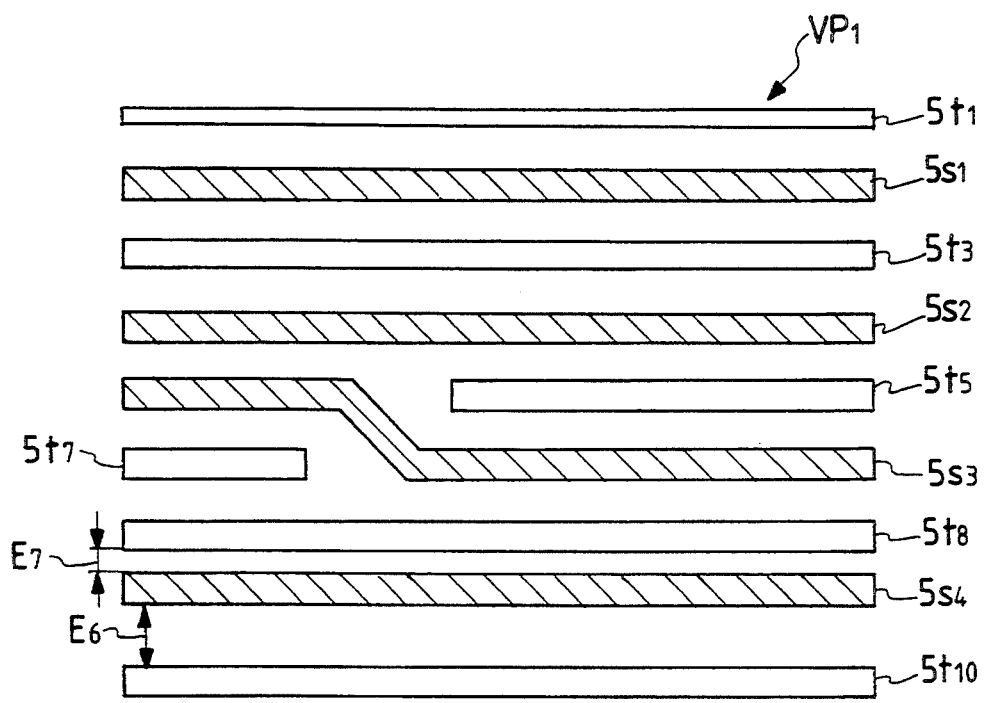
FIG. 9 is a top plan view showing a verifying pattern described with reference to FIG. 8.
Figure 8:
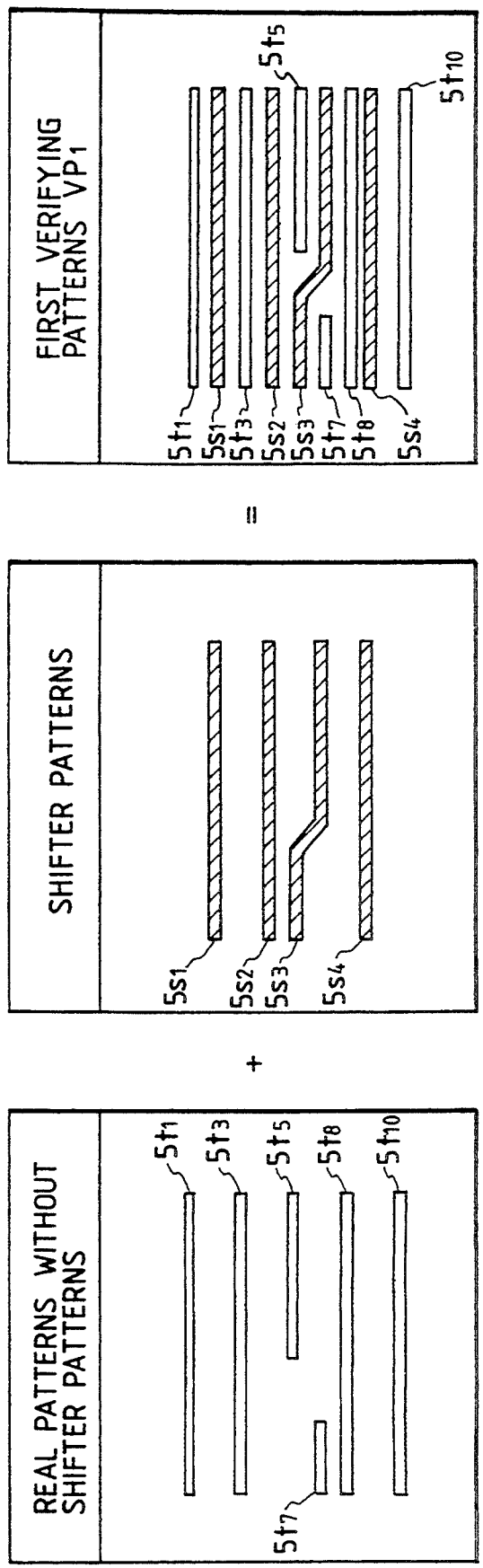
FIG. 8 is a diagram for describing the step of forming a verifying pattern by synthesizing real patterns having no phase shift pattern arranged and phase shift patterns.
Figure 10:
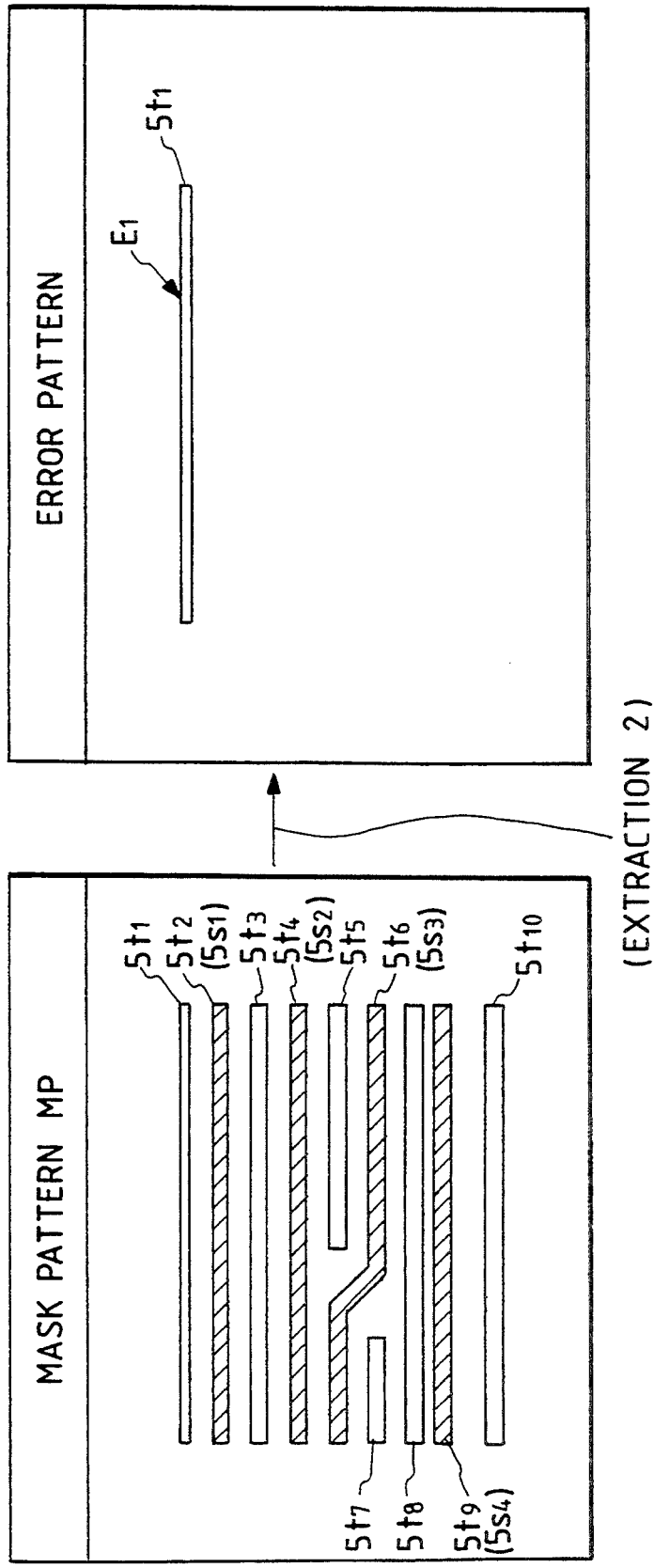
FIG. 10 is a diagram for describing the step of extracting an error pattern by the verification 4 of FIG. 1.
Figure 11:
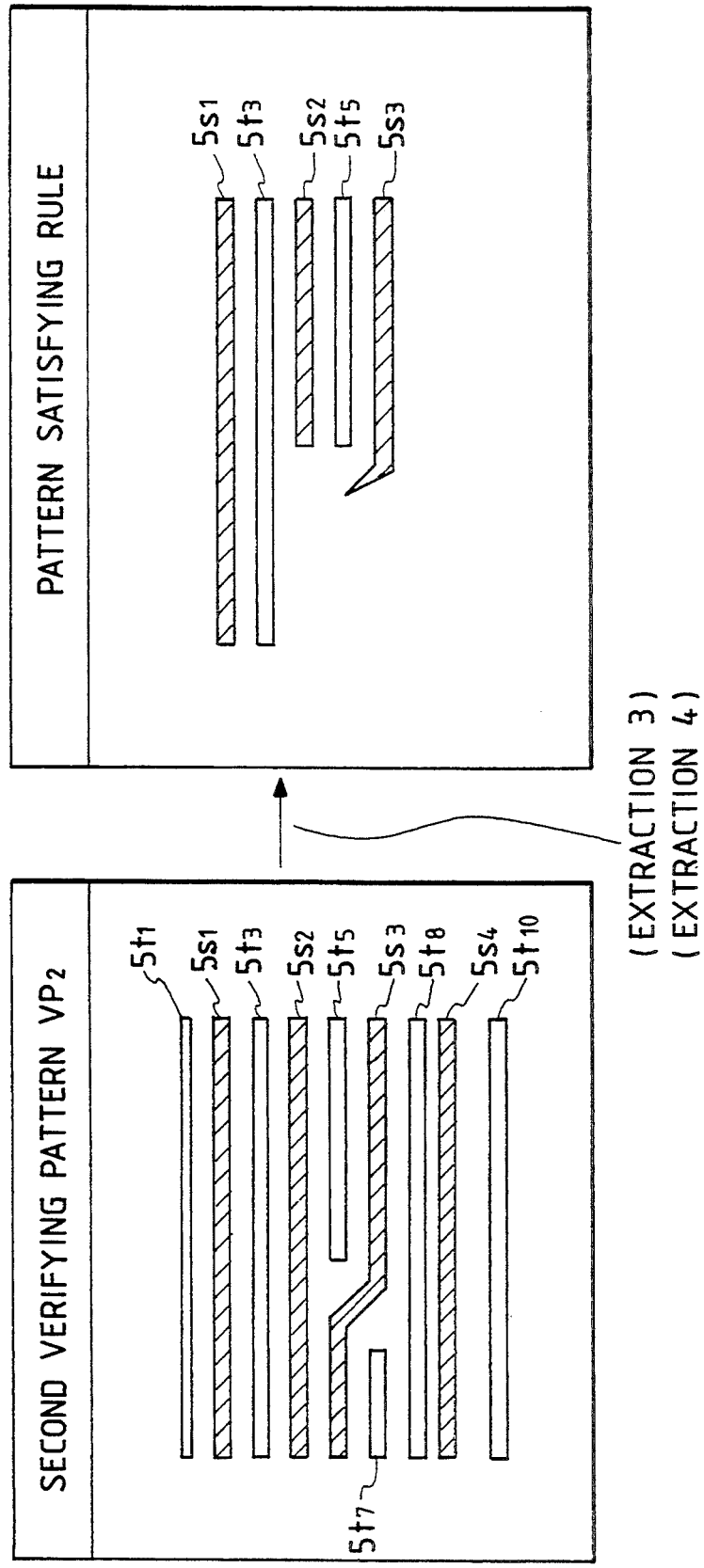
FIG. 11 is a diagram for describing the step of extracting an error pattern by the verification 5 of FIG. 1.
Figure 12:
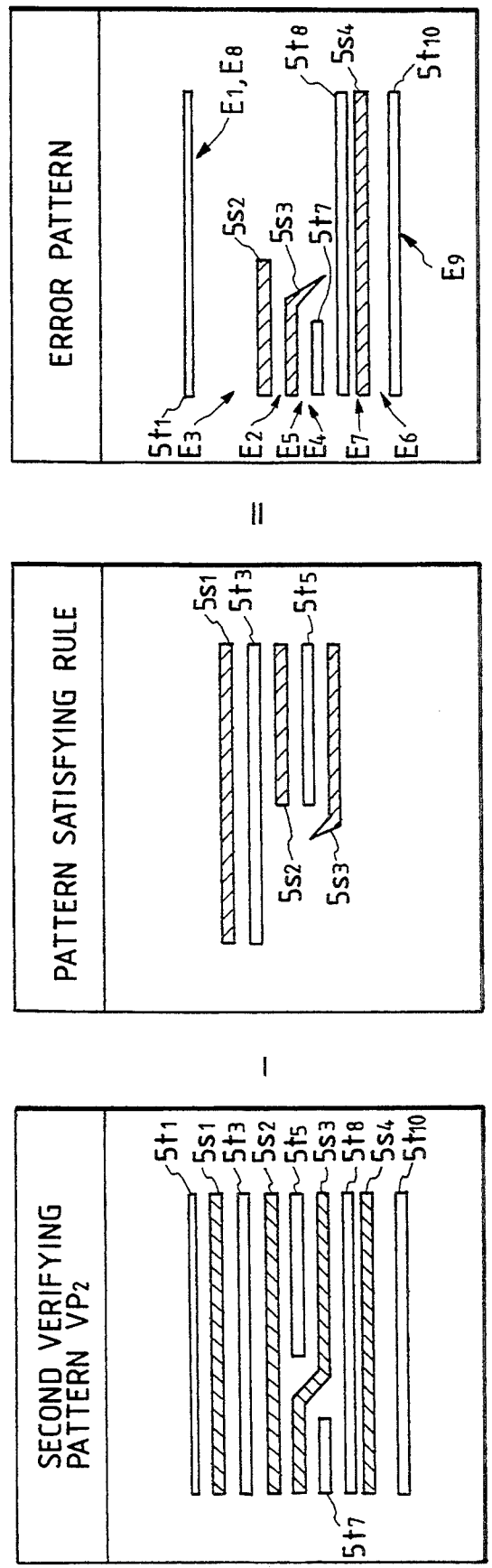
FIG. 12 is a diagram for describing the step of extracting an error pattern by the verification 5 of FIG. 1.
Figure 13:
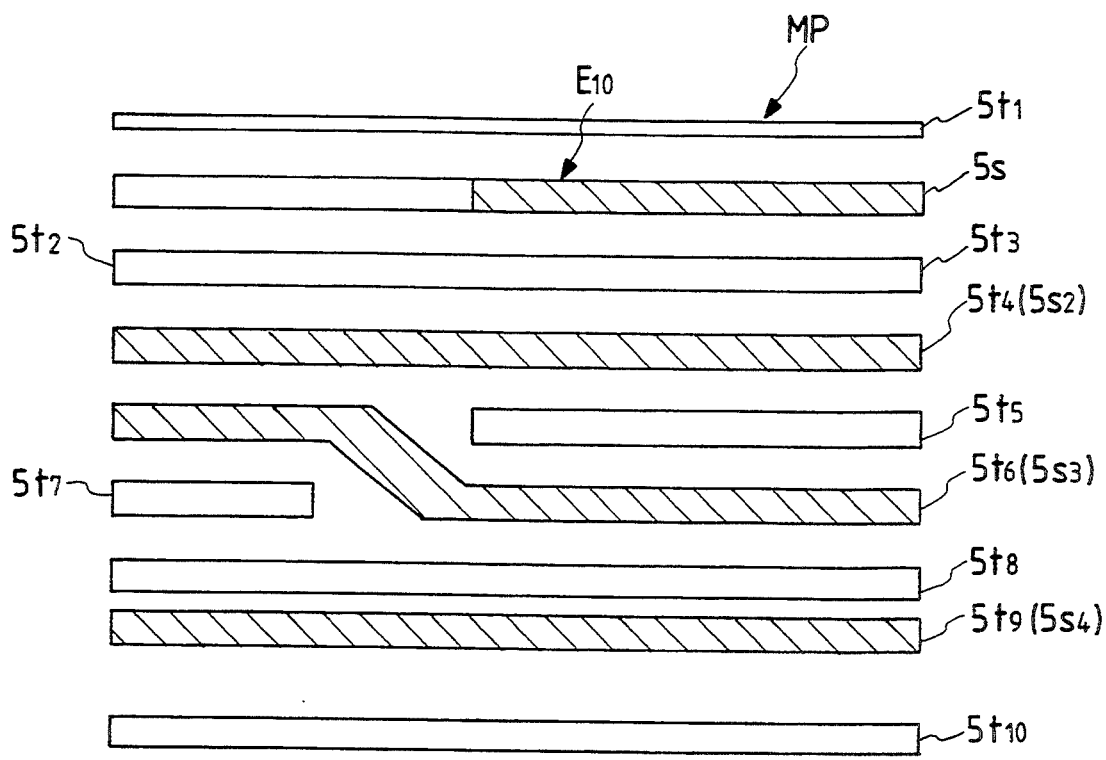
FIG. 13 is a top plan view showing a mask pattern having defective phase shift patterns arranged.
Figure 14:
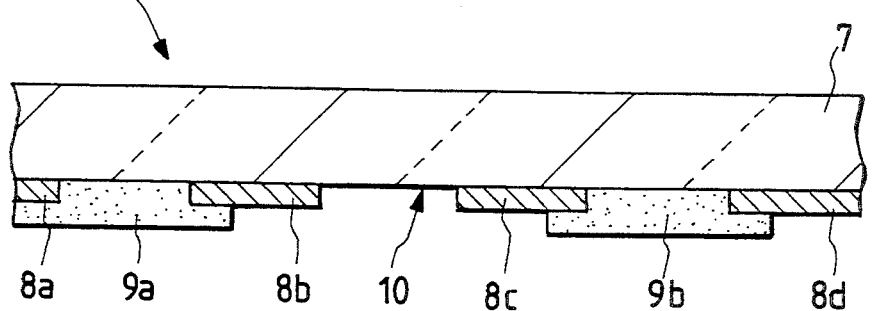
FIG. 14 is a section showing an essential portion of a phase shift mask.
Figure 15:
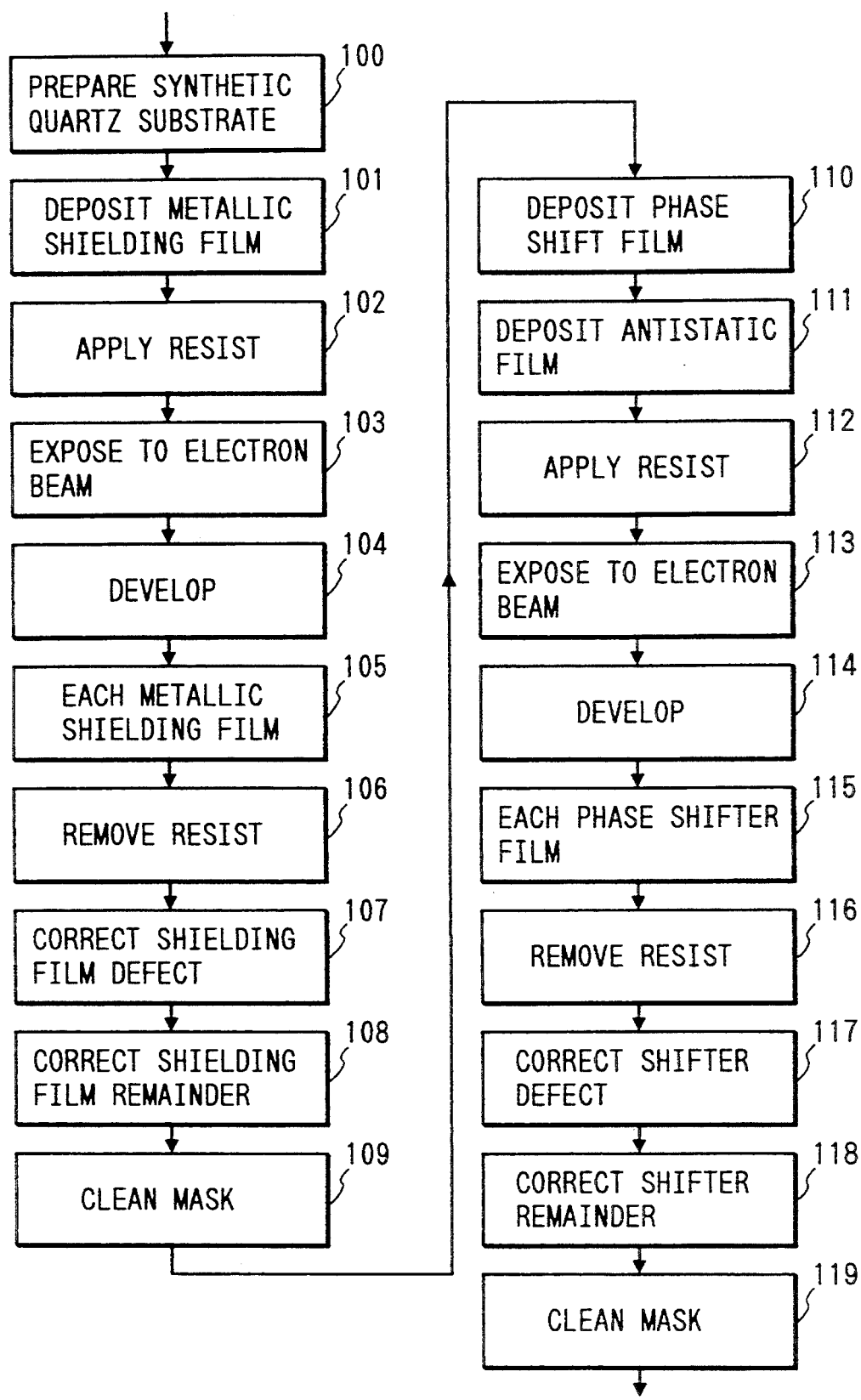
FIG. 15 is a flow chart for describing the steps of fabricating the phase shift mask of FIG. 14.
Figure 16:
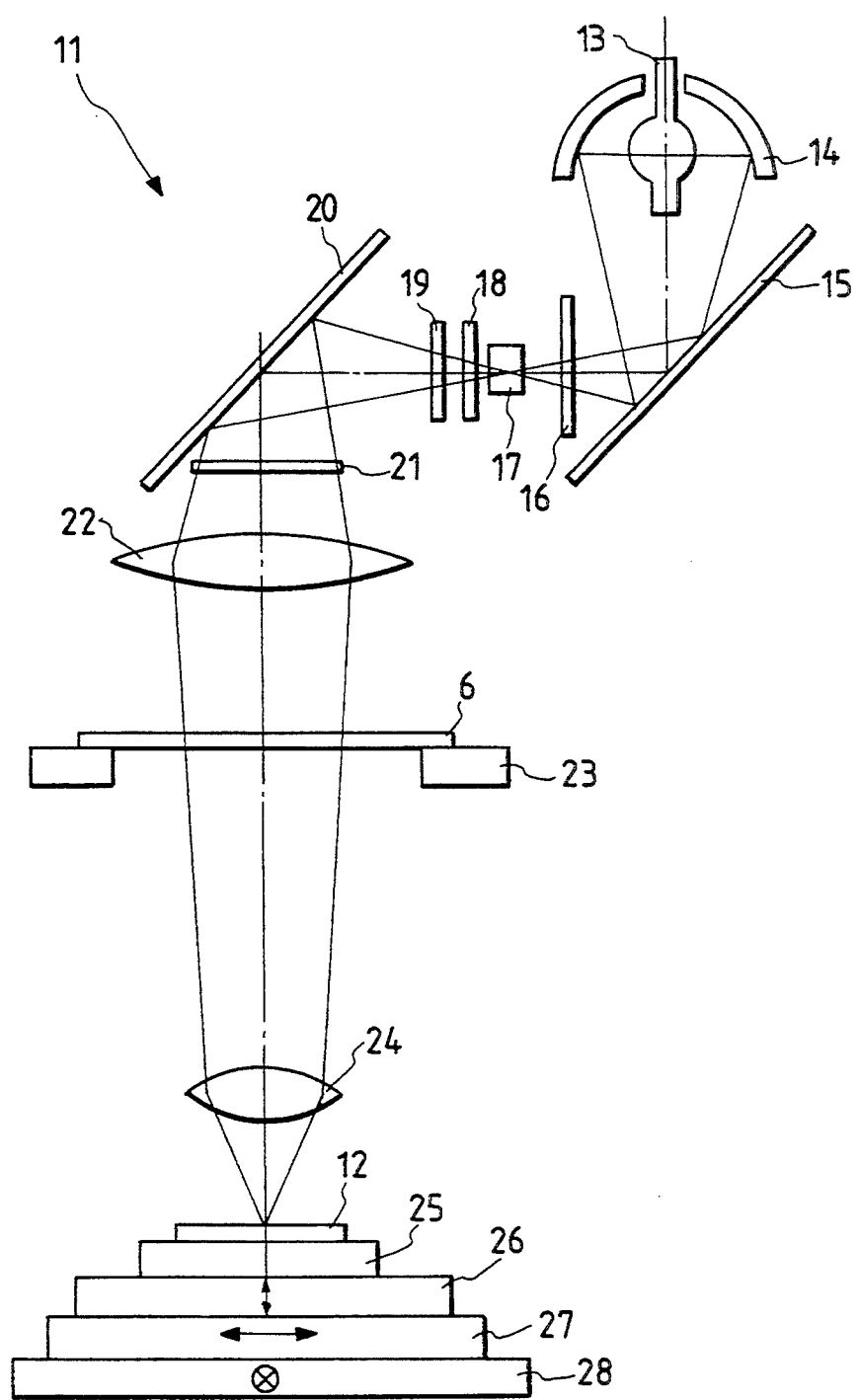
FIG. 16 is a diagram for describing a reducing projection exposure apparatus using the phase shift mask of FIG. 14.

FIG. 1 is a flow chart for describing the steps of verifying a mask pattern of a phase shift mask according to one embodiment of the present invention; FIG. 2 is a diagram for describing a pattern data making system to be used for making the data of the mask pattern of the phase shift mask; FIG. 3 is a top plan view showing an example of the mask pattern; FIG. 4 is a diagram for describing the step of separating the mask pattern of FIG. 3; FIG. 5 is a top plan view showing the phase shift patterns, being verified, of the mask pattern of FIG. 3; FIG. 6 is a diagram for describing the step of extracting real patterns having no phase shift pattern arranged; FIG. 7 is a top plan view showing real patterns having no phase shift pattern arranged; FIG. 8 is a diagram for describing the step of forming a verifying pattern by synthesizing real patterns having no phase shift pattern arranged and phase shift patterns; FIG. 9 is a top plan view showing a verifying pattern described with reference to FIG. 8; FIG. 10 is a diagram for describing the step of extracting an error pattern by the verification 4 of FIG. 1; FIGS. 11 and 12 are diagrams for describing the step of extracting an error pattern by the verification 5 of FIG. 1; FIG. 13 is a top plan view showing a mask pattern having defective phase shift patterns arranged; FIG. 14 is a section showing an essential portion of a phase shift mask; FIG. 15 is a flow chart for describing the steps of fabricating the phase shift mask of FIG. 14; and FIG. 16 is a diagram for describing a reducing projection exposure apparatus using the phase shift mask of FIG. 14.

In the present embodiment 1, the technology of fabricating a phase shift mask to be used in an exposure step or one step of the process for fabricating a semiconductor integrated circuit device, for example, will be described In the following with reference to FIGS. 1 to 15. Incidentally, the masks should include reticles.

First of all, the technology for making the data of the mask pattern of a phase shift mask will be described. Here, the mask pattern means to include a shielding pattern and a phase shift pattern (as will be shortly referred to as the "shifter pattern"), which are formed on a later-described mask substrate.

A pattern data making apparatus to be used for making and verifying the data of the mask pattern of a phase shift mask of the present embodiment 1 is shown in FIG. 2.

A pattern data making apparatus 1 is constructed to include a workstation system 2 and a mainframe system 3, which are electrically connected through a data transmission cable 4.

The workstation system 2 includes an input unit $2a$, a workstation body $2b$, a display $2c$ and an external memory $2d$ for the workstation.

The input unit $2a$ is a device such as a keyboard or mouse for inputting predetermined information to the workstation body $2b$. This workstation body $2b$ is a device for executing a predetermining information processing such as a formation or verification of a mask pattern on the basis of the information inputted from the input unit $2a$. The display $2c$ is an output device for displaying the mask pattern or the like being formed and verified. Incidentally, the workstation body $2b$ is further electrically connected with another output device such as a printer or a plotter, although not shown.

The mainframe system 3 is constructed to include a mainframe body $3a$ and an external memory $3b$ for the mainframe. This external memory $3b$ for the mainframe is set with a pre-verification mask pattern data area $3b_1$, a rule checking program area $3b_2$, a verified mask pattern data area $3b_3$ and a post-verification mask pattern data area $3b_4$.

The pre-verification mask pattern data area $3b_1$ is stored with data concerning the mask pattern such as the shape, arrangement coordinates or rotational coordinates of the mask pattern before verification of propriety.

The rule checking program area $3b_2$ is stored with a program for checking whether or not the following first to fifth rules are observed in the mask pattern of the phase shift mask. Incidentally, in the present embodiment 1, those rules will be described in case a wiring pattern having a line width of 0.35 $\mu$m is to be transferred to a photoresist film.

The first rule is as follows. Specifically, in case the individual lights having transmitted through patterns adjacent to each other are in phase, the gap between those patterns (as will be referred to as the "in-phase patterns") has to be no less than 0.5 $\mu$m, for example.

The second rule is as follows. Specifically, in case the individual lights having transmitted through patterns adjacent to each other are out of phase, the gap between those patterns (as will be referred to as the "out-of-phase patterns") has to be less than 0.35 to 0.5 $\mu$m, for example.

The reason why the size between the patterns adjacent to each other is regulated in those ways is as follows. The phase shifting method is a technology for enhancing the resolution of pattern images by overlapping the peaks of n-th order of the individual lights having transmitted through the patterns adjacent to each other and by strengthening or weakening the intensities of the lights at the overlapped potions. Here, if the gap of the adjacent patterns deviates from the designed value, the peaks of n-th order of the individual lights to be overlapped go out of their relative positions so that the intensities of the lights cannot be strengthened or weakened, as intended by the designer.

The third rule is as follows. Specifically, the pattern width has to be on principle 0.35 $\mu$m, for example.

The fourth rule is as follows. Specifically, in case the pattern is for forming a one-side isolated wiring or a two-side isolated wiring, the pattern width has to be no less than 0.4 $\mu$m, for example.

Here, the "one-side isolated wiring" is defined to have no other pattern within a predetermined distance, e.g., less 0.5 $\mu$m at one side of a wiring, and the "two-side isolated wiring" is defined to have no other pattern within a predetermined distance, e.g., less 0.5 $\mu$m at two sides of a wiring.

The reason why the width of the pattern to be formed with the one-side isolated wiring or the two-side isolated wiring is thus made larger than the minimum working size is to compensate the thinning of a pattern image, which is caused because the optical operation by the phase shifting method cannot be sufficed, for example.

The fifth rule is as follows. Specifically, the pattern width of the in-phase patterns has to be no less than 0.5 $\mu$m, for example.

The sixth rule is as follows. Specifically, a real pattern and a corresponding shifter pattern have to be precisely overlapped. This rule is violated if a single shifter pattern exists, if a shifter pattern is defective, if a shifter pattern is confined in a real pattern, or if a real pattern and a shifter pattern intersect.

The verified mask pattern data area $3b_3$ of the pattern data making apparatus 1 is stored with a mask pattern being verified and formed. On the other hand, the post-verification mask pattern data area $3b_4$ is stored with the data of a completed correct mask pattern.

Next, the technology for verifying the data of the mask pattern of a phase shift mask will be described in the following.

First of all, an example of a mask pattern MP having its data being made is shown in FIG. 3. The mask pattern MP has real patterns $5t_1$ to $5t_{10}$ and shifter patterns $5s_1$ to $5s_4$ laid, as hatched, over the real patterns $5t_2$, $5t_4$, $5t_6$ and $5t_9$.

Here, the real patterns $5t_1$ to $5t_{10}$ are patterns for forming over a mask substrate the patterns of the same shape as that of the patterns to be formed over a semiconductor wafer. On the other hand, the shifter patterns $5s_1$ to $5s_4$ are patterns for forming over the mask substrate a phase shift film for establishing a phase difference in the lights to transmit through the mask substrate.

In FIG. 3, however, the following errors $E_1$ to $E_9$ are contained for describing the verification step of the present embodiment 1.

The first error $E_1$ is that the real pattern $5t_1$ has a width less than the minimum working size (e.g., 0.35 μm) of the wiring pattern. This violates the aforementioned third rule.

The second error $E_2$ is that the gap between the real patterns $5t_4$ and $5t_6$ or between the shifter patterns $5s_2$ and $5s_3$ is locally less than the minimum gap (e.g., 0.5 μm) in the in-phase patterns. This violates the aforementioned first rule.

The third error $E_3$ is that the real patterns $5t_4$ and $5t_6$ and the shifter patterns $5s_2$ and $5s_3$ are locally in phase but have a width of the minimum working size of the wiring pattern. This violates the aforementioned fifth rule.

The fourth error $E_4$ is that the gap between the real patterns $5t_7$ and $5t_8$ adjacent to each other is locally less than the minimum gap in the in-phase patterns. This violates the aforementioned first rule.

The fifth error $E_5$ is that the real patterns $5t_7$ and $5t_8$ are locally in phase but have a width of the minimum working size of the wiring pattern. This violates the aforementioned fifth rule.

The sixth error $E_6$ is that the gap between the real pattern $5t_9$ or the shifter pattern $5s_4$ and the real pattern $5t_{10}$ is larger than the maximum gap (e.g., 0.5 μm) between the out-of-phase patterns and have a width of the minimum working size. This violates the aforementioned second rule 2.

The seventh error $E_7$ is that the gap between the real pattern $5t_8$ and the real pattern $5t_9$ or the shifter pattern $5s_4$ is less than the minimum gap (e.g., 0.35 μm) of the out-of-phase patterns. This violates the aforementioned second rule.

The eighth error $E_8$ is that the real pattern $5t_1$ has no other pattern thereover and has a width less than the minimum working size of the one-side isolated wiring. This violates the aforementioned fourth rule.

The ninth error $E_9$ is that the real pattern $5t_{10}$ has no other pattern thereover and has a width less than the minimum working size of the one-side isolated wiring. This violates the aforementioned fourth rule.

Next, the method of verifying the mask pattern of the phase shift mask according to the present embodiment 1 will be described by way of such mask pattern MP along steps 100 to 106 of FIG. 1 with reference to FIGS. 3 to 13.

Incidentally, the technology of making the data of the mask pattern of the phase shift mask is disclosed in Japanese Patent Application No. 117355/1991 (as filed on May 22, 1991) of Takekuma et al., which should form part of the description of the present invention.

First of all, as shown in FIG. 4, the aforementioned mask pattern MP is separated (at Step 100) into a real pattern data layer having only the data of the real patterns $5t_1$ to $5t_{10}$ and a shifter pattern data layer having only the data of the shifter patterns $5s_1$ to $5s_4$.

Subsequently, in the present embodiment 1, the gap of the in-phase patterns, for example, is verified (in Verifications 1 and 2).

In Verification 1, of the real patterns $5t_1$ to $5t_{10}$ of the mask pattern MP of FIG. 3, for example, the real patterns $5t_2$, $5t_4$, $5t_9$ having the shifter patterns $5s_1$ to $5s_4$ arranged therewith have their individual gaps verified.

Here, since the real patterns $5t_2$, $5t_4$, $5t_6$ and $5t_9$ having the shifter patterns are registered with the shifter patterns $5s_1$ to $5s_4$, the individual gaps of the shifter patterns $5s_1$ to $5s_4$ may be verified so as to verify the individual gaps of the real patterns $5t_2$, $5t_4$, $5t_6$ and $5t_{10}$ having the shifter patterns. FIG. 5 shows these shifter patterns $5s_1$ to $5s_4$.

And, it is verified (at Step 101) whether or not the individual gaps of those shifter patterns $5s_1$ to $5s_4$ violate the rule of the gap of the in-phase patterns, i.e., the aforementioned first rule. This makes it possible to find out the aforementioned error $E_2$ that the gap between the shifter patterns $5s_2$ and $5s_3$ is locally less than the minimum gap of the in-phase patterns. Here, the operator can correct that error $E_2$ to store the data of the corrected mask pattern in the verifying mask pattern data area $3b_3$ (as shown in FIG. 2).

In Verification 2, of the real patterns $5t_1$ to $5t_{10}$ of the mask pattern MP of FIG. 3, for example, the individual gaps of the real patterns $5t_1$, $5t_3$, $5t_5$, $5t_7$, $5t_8$ and $5t_{10}$ having none of the shifter patterns $5s_1$ to $5s_4$ arranged are verified.

Here, first of all, as shown in FIG. 6, the real patterns $5t_2$, $5t_4$, $5t_6$ and $5t_9$ having the shifter patterns are subtracted from all the real patterns $5t_1$ to $5t_{10}$ to extract (at Step 102a) the real patterns $5t_1$, $5t_3$, $5t_5$, $5t_7$, $5t_8$ and $5t_{10}$ laving no shifter pattern. These real patterns $5t_1$, $5t_3$, $5t_5$, $5t_7$, $5t_8$ and $5t_{10}$ having no shifter pattern are shown in FIG. 7.

And, it is verified (at Step 102b) whether or not the individual gaps of the real patterns $5t_1$, $5t_3$, $5t_5$, $5t_7$, $5t_8$ and $5t_{10}$ having no shifter pattern violate the minimum gap rule of the in-phase patterns, i.e., the first rule.

As a result, it is possible to find out the aforementioned error $E_4$ that the gap between the real patterns $5t_7$ and $5t_8$ is locally less than the minimum gap of the in-phase patterns. Here, the operator can correct that error $E_4$ to store the data of the corrected mask pattern in the verifying mask pattern data area $3b_3$ (as shown in FIG. 2).

After Verification 2, in the present embodiment 1, the gap of the out-of-phase patterns, for example, is verified (in Verification 3).

In Verification 3, for example, as shown in FIG. 3, the real patterns $5t_1$, $5t_3$, $5t_5$, $5t_7$, $5t_8$ and $5t_{10}$ having no shifter pattern extracted as above and the shifter patterns $5s_1$ to $5s_4$ are synthesized to form a first verifying pattern $VP_1$.

This first verifying pattern $VP_1$ is shown in FIG. 9.

And, it is verified (at Step 103) whether or not the gap of the individual patterns of the first verifying pattern $VP_1$ violates the minimum gap rule of the out-of-phase patterns, i.e., the second rule.

As a result, it is possible to find out the aforementioned errors $E_6$ and $E_7$ that the gap between the real pattern $5t_8$ and the shifter pattern $5s_4$ and the gap between the real pattern $5t_{10}$ and the shifter pattern $5s_4$ are not the regulated gaps of the out-of-phase patterns. Here, the operator can correct that errors $E_6$ and $E_7$ to store the data of the corrected mask pattern in the verifying mask pattern data area $3b_3$ (as shown in FIG. 2).

Incidentally, the first verifying pattern $VP_1$ is tentatively formed for verifying the mask pattern.

After Verification 3, in the present embodiment 1, the width of the pattern, for example, is verified (in Verification 4).

In Verification 4, as shown in FIG. 10, for example, it is verified (at Step 4) whether or not the individual patterns of the mask pattern MP violate the minimum working size rule of the wiring pattern, i.e., the aforementioned third rule.

As a result, the real pattern $5t_1$ having a pattern width less than the minimum working size, i.e., the error $E_1$ can be found out as the error pattern. Here, the operator can correct that error $E_1$ to store the data of the corrected mask pattern in the verifying mask pattern data area $3b_3$ (as shown in FIG. 2).

After Verification 4, in the present embodiment 1, the mutually relating pattern gap and width, for example, are verified (in Verification 5).

In Verification 5, the real patterns $5t_2$, $5t_4$, $5t_6$ $_{1\ and\ 5}t_9$ having the shifter patterns are subtracted from all the real patterns $5t_1$ to $5t_{10}$ shown in FIG. 6, to form the real patterns $5t_1$, $5t_3$, $5t_5$, $5t_8$ and $5t_{10}$ having no shifter pattern. On the basis of these patterns, a second verifying pattern $VP_2$ shown in FIG. 11 is formed.

Subsequently, there are extracted (at Steps 105$a$ and 105$b$) both a wiring satisfying the minimum line width rules of the one-side isolated wiring and the two-side isolated wiring and the pattern satisfying the minimum line width rules in cases of the in-phase patterns and the out-of-phase patterns.

After this, as shown in FIG. 12, the patterns satisfying those rules are eliminated from the second verifying pattern $VP_2$ to extract the error pattern.

As a result, the errors $E_1$ to $E_9$ can be found out. Here, the operator can correct these errors $E_1$ and $E_9$ to store the data of the corrected mask pattern in the verifying mask pattern data area $3b_3$ (as shown in FIG. 2).

In the present embodiment 1, however, the patterns satisfying the rules are extracted at Verification 5, and the patterns satisfying the rules are then eliminated from the second verifying pattern $VP_2$ to extract the error patterns. Despite of this, however, the error patterns can be directly extracted.

At last, in the present embodiment 1, the overlaps or the like between the real patterns and the shifter patterns are verified (at Verification 6). This will be described by using the mask pattern MP, as shown in FIG. 13.

FIG. 13 shows the mask pattern MP, in which the shift pattern $5s_5$ arranged on the real pattern $5t_2$ is defective, so as to describe Verification 6.

In Verification 6, the mask pattern MP shown in FIG. 13 is verified (at Step 106) whether or not it violates the aforementioned sixth rule, such as whether or not the real patterns $5t_1$ $5t_{10}$ and the corresponding shifter patterns $5s_2$ to $5s_5$ are precisely overlapped, that is, whether or not there is a single shifter pattern, whether or not a shifter pattern is defective, whether or not the real patterns and the shifter patterns intersect, or whether the shifter patterns are included in the real patterns.

As a result, it is possible to find out an error $E_{10}$ that the shifter pattern $5s_5$ which should intrinsically overlap the entirety of the real pattern $5t_2$ partially overlaps the real pattern $5t_2$. Here, the operator can correct these errors $E_{10}$ to store the data of the corrected mask pattern in the verifying mask pattern data area $3b_3$ (as shown in FIG. 2).

Through Steps 100 to 106 of Verifications 1 to 4 thus far described, the data of the correct mask pattern of the phase shift mask are made and stored in the aforementioned verified mask pattern data area $3b_3$ of FIG. 2.

After this, the data of the correct mask pattern are separated into the data of the real patterns and the data of the shifter patterns, and the drawing data of the shielding patterns are made on the basis of the data of the real patterns to make the drawing data of the shifters on the basis of the data of the shifter patterns.

Here, the drawing data are the pattern drawing data to be used in a drawing apparatus used for forming the shielding patterns or the shifter patterns on the mask substrate.

Next, the phase shift mask of the present embodiment 1 will be described in the following. FIG. 14 is a section showing an essential portion of a phase shift mask 6 of the present embodiment 1. In the same Figure: reference numeral 7 designates a mask substrate made of synthetic glass or the like; numerals 8$a$ to 8$d$ designate shielding films made of chromium (Cr) or the like; numerals 9$a$ and 9$b$ designate phase shifter films or shifters; and numeral 10 designates an exposed portion or non-shift light transmitting portion of the mask substrate. Incidentally, the exposed substrate portion should not always be limited to the exposed quartz substrate itself, but the aforementioned substrate itself may be constructed to include a quartz substrate making up the substrate body and a thin transparent film formed on the surface of the former.

The aforementioned phase shift films 9$a$ and 9$b$ designate the thickness of a transparent material (i.e., the thickness at the central portion of the shifter opening), which is determined by the refractive index of the transparent material and the wavelength of the transmission light, and are thin films made of SOG (i.e., Spin On Glass), indium oxide ($InO_x$) or the like.

Next, a method of forming the aforementioned phase shift mask 6 will be described along Steps 100 to 119 of FIG. 15.

First of all, a synthetic quarts plate has its surface polished and cleaned to make (at Step 100) the mask substrate 7. After this, there is deposited (at Step 101) over all the principal face of the mask substrate 7 a metallic shielding film (although not shown) made of chromium (Cr) of about 0.05 to 0.3 $\mu m$, for example, by the sputtering method or the like.

Subsequently, an electrosensitive resist film (although not shown) having a thickness of 0.1 to 0.8 $\mu m$, for example, is applied (at Step 102) to the whole surface of that metallic shielding film by the spin coating method or the like. This resist film is exposed by the direct drawing method using an electron beam exposure system, for example, to transfer a desired semiconductor integrated circuit pattern to the electrosensitive resist film over the metallic film.

At the time of this electron beam direct drawing process, in accordance with the drawing data, which are made on the basis of the data of the real patterns of the correct mask pattern data made by the aforementioned mask pattern data making method and stored after the verification of the pattern data making apparatus 1 in the mask pattern data area $3b_4$, the mask substrate 7 has its designated position irradiated with the electron beam to transfer the semiconductor integrated circuit pattern of designated shape to the aforementioned electrosensitive resist film.

After this, in case the aforementioned electrosensitive resist film is of the positive type, the exposed portion is removed (at Step 104) by a predetermined developing liquid. The aforementioned metallic shielding film is etched (at Step 105) by the wet etching method or the like by using the remaining electrosensitive resist film as an etching mask, to form a shielding pattern of predetermined shape on the mask substrate 7.

In case the aforementioned electrosensitive resist film of the negative type, on the other hand, the exposed portion is removed (at Step 104) by a predetermined developing liquid. The aforementioned metallic shielding film is etched (at Step 105) by the wet etching method or the like by using the remaining electrosensitive resist film as an etching mask, to form a pattern of predetermined shape on the mask substrate 7. Thus, the shielding and transparent areas of predetermined shapes are formed over the mask substrate 7.

Next, through a resist film removing Step 106, a shielding film defect correcting Step 107, a shielding film remainder correcting Step 108 and a mask cleaning Step 109, the phase of the transparent light is shifted over the mask substrate 7, that is, a phase shift film made of SOG or the like is deposited (at Step 110) on the mask substrate 7 by the spin coating method.

Here, the SOG is baked at a high temperature after it has been applied to the aforementioned mask substrate 7. At this time, in order to invert the phase of the light, the relation of $d = \lambda/2(n-1)$ has to be satisfied, if the phase shift film has a thickness of d, if the transparent light has a wavelength of $\lambda$, and if the transparent film has a refractive index of n.

If the wavelength $\lambda$ of the light used for the exposure is 0.365 $\mu$m (of the line) and if the refractive index n of the phase shift film is 1.5, for example, the thickness of the phase shift film may be about 0.37 $\mu$m.

Subsequently, an antistatic film made of aluminum (Al) and having a thickness of 0.05 $\mu$m, for example, is deposited (at Step 111) by the sputtering method or the like, and the electrosensitive resist film for patterning the phase shift film is applied (at Step 112) to the antistatic film.

After this, that resist film is exposed (at Step 113) like before to the direct drawing method or the like by the electron beam exposure apparatus to transfer the desired shift pattern to the electrosensitive resist film.

At the time of this electron beam direct drawing process, in accordance the drawing data which are made on the basis of the shifter pattern of the correct mask pattern data stored in the mask pattern area $3b_4$ after the verification of the aforementioned pattern data making apparatus 1, the mask substrate 7 has its designated position irradiated with the electron beam to transfer the shift pattern of designated shape to the electrosensitive resist film.

After this, the phase shift mask 6 is formed through a developing Step 114, an etching Step 115 for etching the aforementioned phase shift film by using the resist pattern formed by the development as an etching mask, an etching Step 116 of the resist film, a shifter defect correcting Step 117, a shifter remainder correcting Step 118 and a mask cleaning Step 119.

Next, an exposure technology using the phase shift mask 6 of the present embodiment 1 will be described in the following.

First of all, a reducing production exposure system to be used at the exposure step of the present embodiment 1 is shown in FIG. 16. The i-th line 5:1 reducing projection exposure system of lens step and repeat type to be applied to that exposure is exemplified by the i-th line stepper NRS-1755i7A (NA=0.5, the exposure area=17.5 mm square) of Nippon Kogaku (Nikon).

In the same Figure: numeral 12 designates a semiconductor wafer made of single crystalline silicon or the like of 5 to 8 inches; numeral 13 designates a high-tension mercury lamp acting as an exposing light source; numeral 14 designates a condenser mirror; numeral 15 designates a first plane reflecting mirror; numeral 16 designates a shutter; numeral 17 designates a fly-eye lens; numeral 18 designates an aperture for adjusting a coherence factor $\sigma$ (=0.5 in the present embodiment 1); numeral 19 designates a short-cut filter for cutting the far ultraviolet having a shorter wavelength than the i-th line in case of the i-th line (of 365 nm); numeral 20 designates a second plane reflecting mirror; numeral 21 designates a mask blind for determining the range of a transfer range; numeral 22 designates a condenser lens for forming a Koehler front face; numeral 28 designates a mask holder capable of being finely moved in at least Z axis direction while holding the phase shift mask 6; and numeral 24 designates a reducing projection lens which is composed generally of a number of lens groups and in which the side of the aforementioned semiconductor wafer 12 is made telecentric in the reducing projection system 11, as exemplified above. Incidentally, the side of the phase shift mask 6 can also be made telecentric. Numeral 25 designates a wafer sucking bed for sucking the semiconductor wafer 7; numeral 26 designates a Z-axis carriage (in the vertical direction); numeral 27 designates an X-axis carriage (in the horizontal transverse direction); and numeral 28 designates a Y-axis carriage (in the horizontal longitudinal direction) for constituting an X-Y stage together with the aforementioned X-axis carriage 27.

At the time of the exposure process, the light emitted from the high-tension mercury lamp 13 is guided through the first plane reflecting mirror 15, the shutter 16, the fly-eye lens 17, the aperture 18, the short-cut filter 19, the second plane reflecting mirror 20, the mask blind 21, the condenser lens 22, the phase shift mask 6 and the reducing projection lens 24, to irradiate the surface of the semiconductor wafer 12.

As a result, the predetermined semiconductor integrated circuit pattern having a fine wiring pattern of 0.35 $\mu$m, for example, can be transferred to the photoresist film applied to the semiconductor wafer 12.

Incidentally, the aforementioned phase shift mask exposure technology is disclosed in Japanese Patent Application No. 170946/1991 (as filed on Jul. 11, 1991), which should form part of the description of the present invention.

As described hereinbefore, according to the present embodiment 1, by conducting the aforementioned Verifications 1 to 6 at the time of making the data of the mask pattern of the phase shift mask 6, the data of the mask pattern of the phase shift mask 6 can be verified and corrected to make the data of the correct mask pattern of the phase shift mask.

By subjecting the photoresist film on the surface of the semiconductor wafer to an exposure by using that phase shift mask, moreover, it is possible to fabricate a highly reliable semiconductor integrated circuit device having a fine wiring pattern of 0.35 $\mu$m, for example.

Embodiment 2

Figure 19:
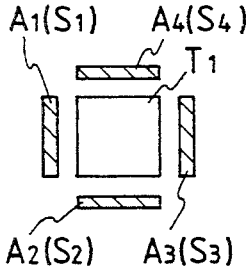
FIG. 19 is a top plan view showing a plurality of connection hole pattern cells to be used in a verifying step of the present embodiment 2.
Figure 20:
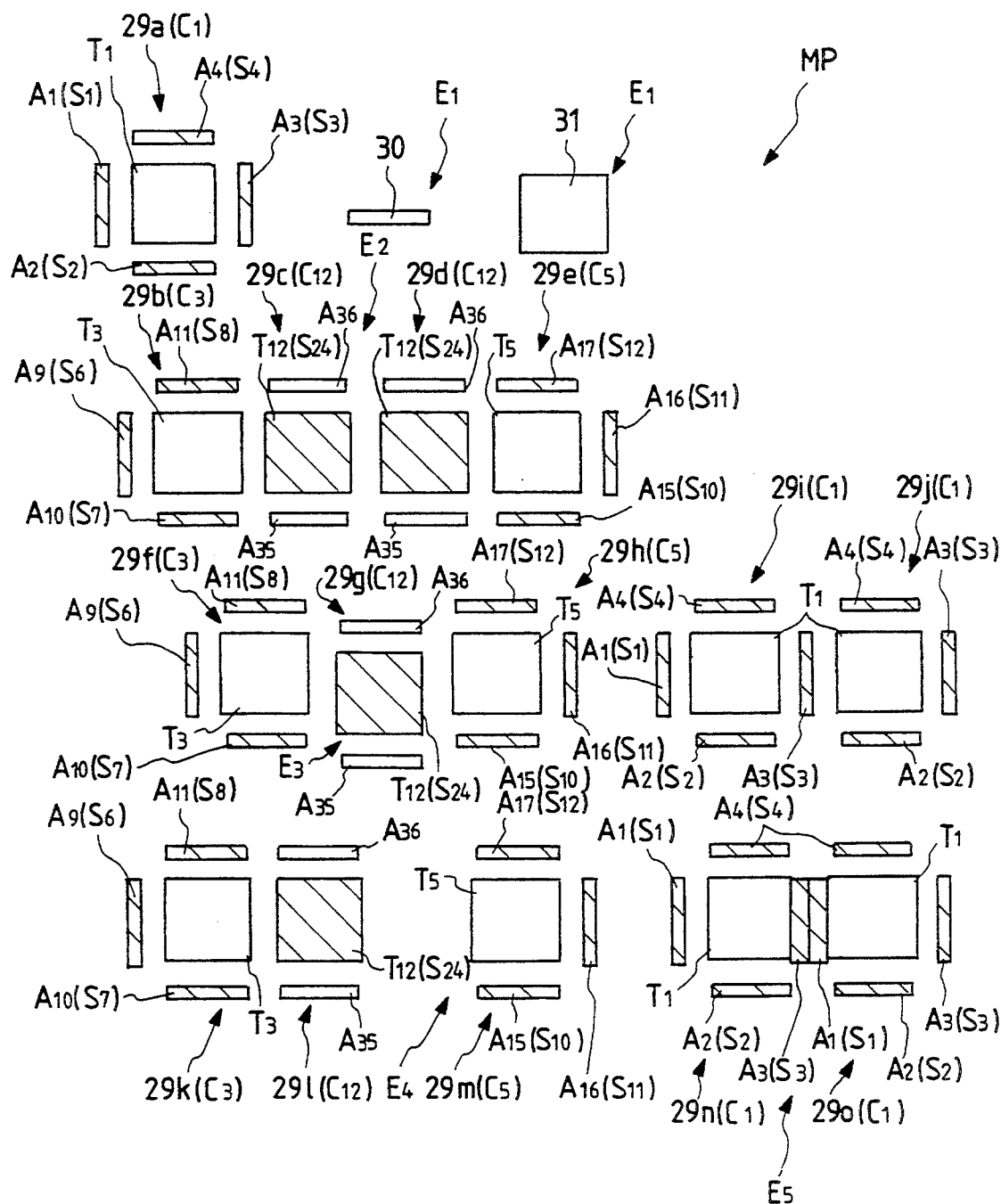
FIG. 20 is a top plan view showing an example of the mask pattern.
Figure 21:
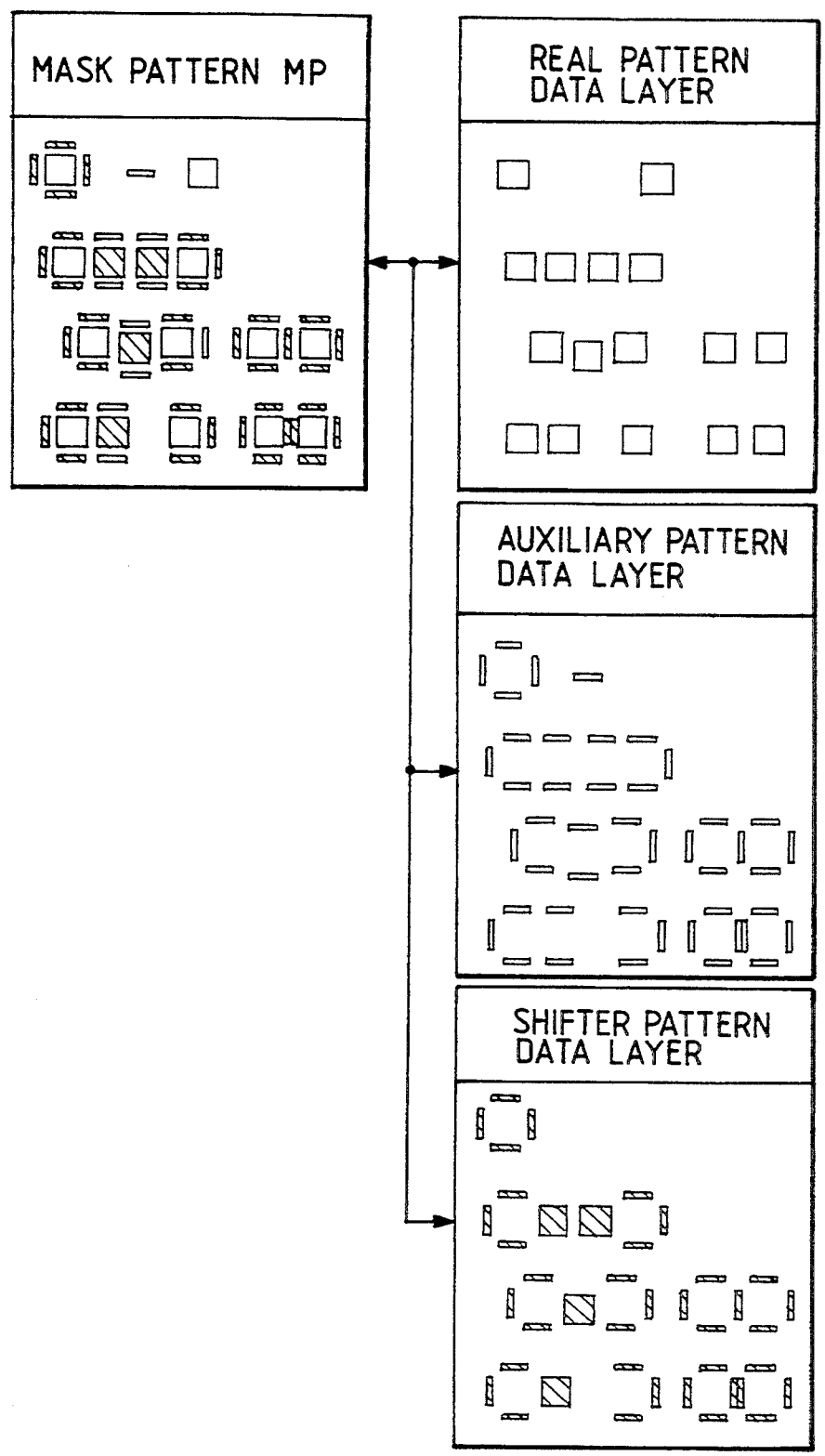
FIG. 21 is a diagram for describing the step of separating a mask pattern.
Figure 22:
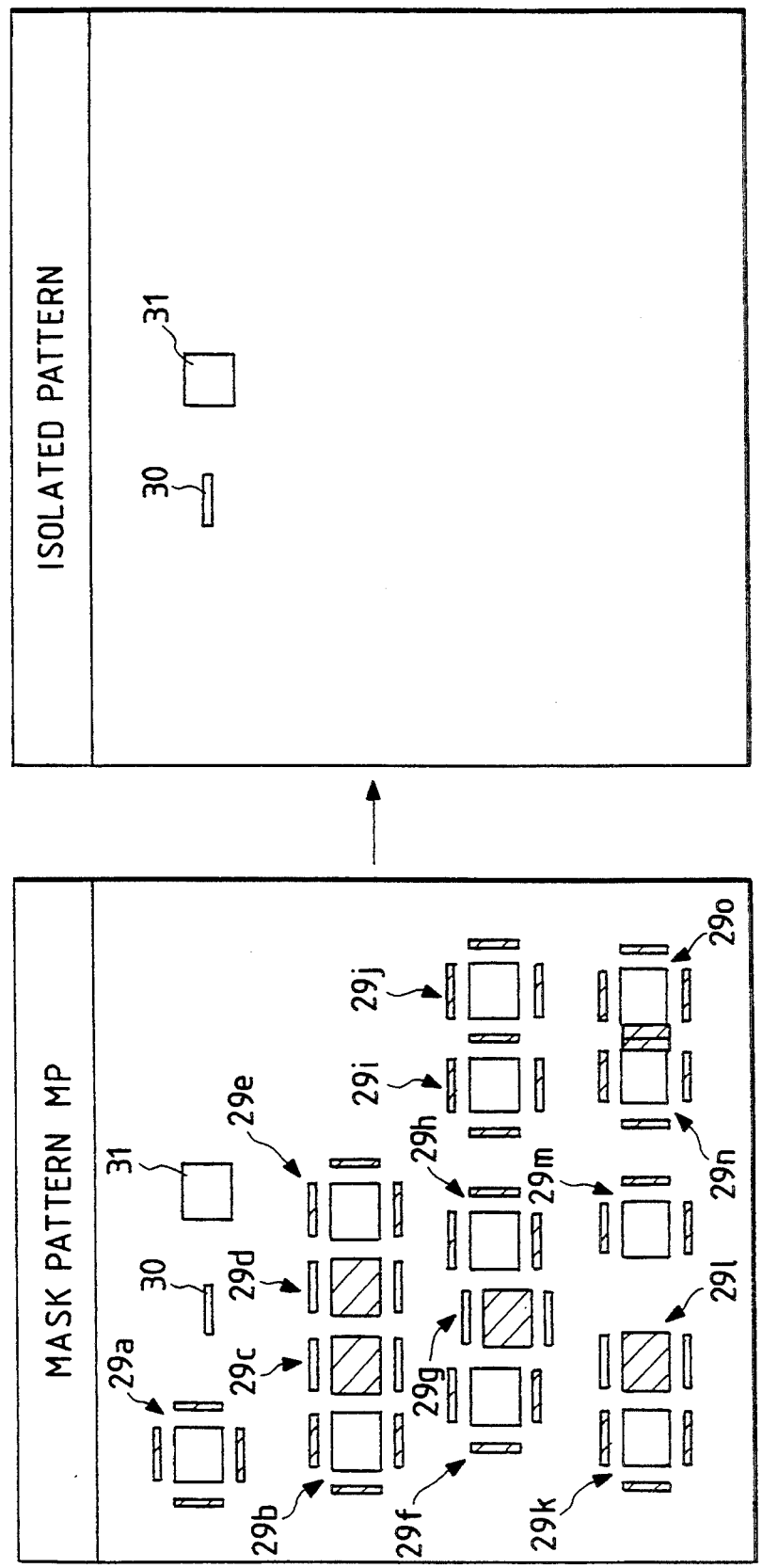
FIG. 22 is a diagram for describing the step of extracting isolated patterns.
Figure 24:
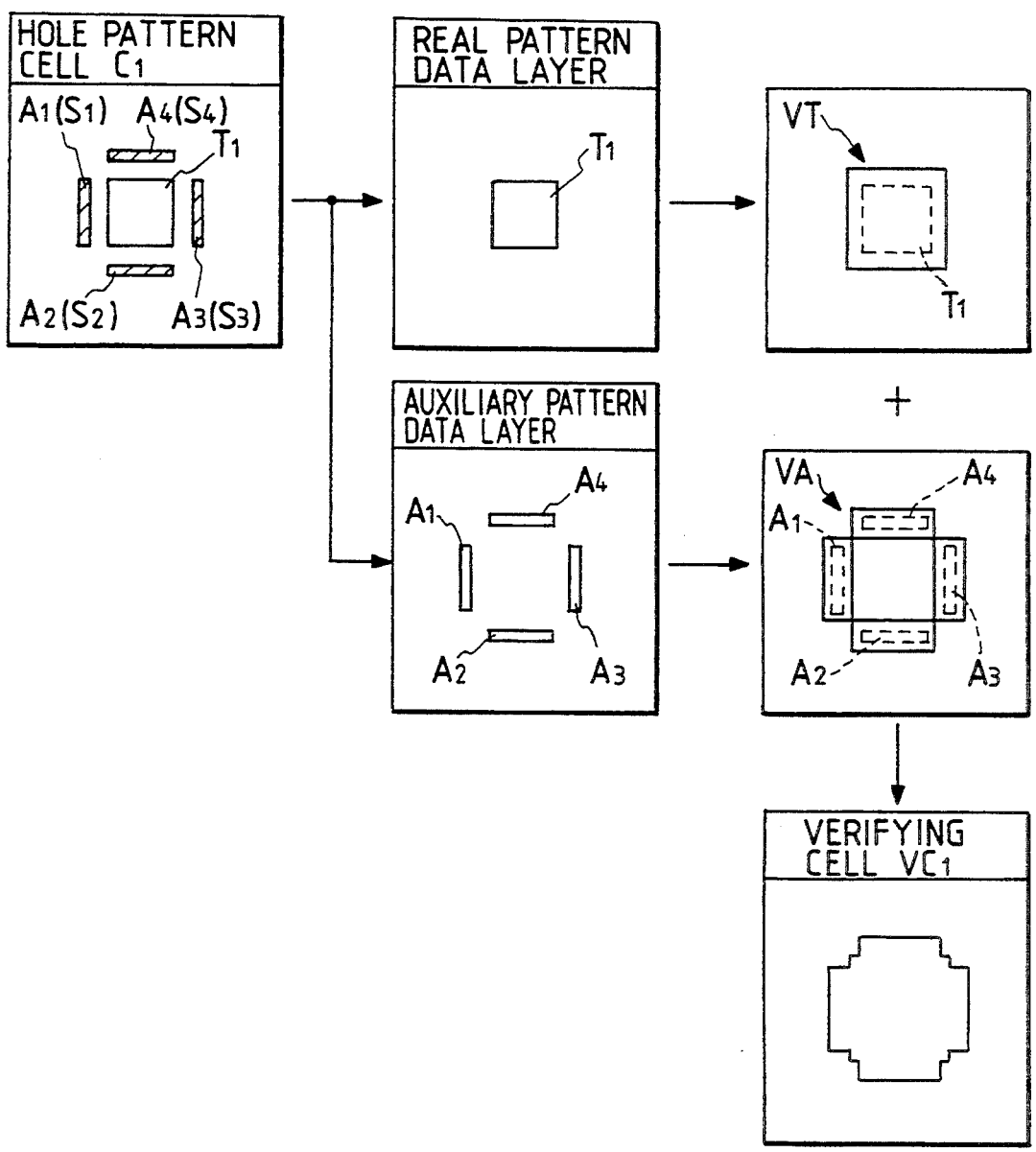
FIG. 24 is a diagram for describing the method making the verifying cells of FIG. 23.
Figure 25:
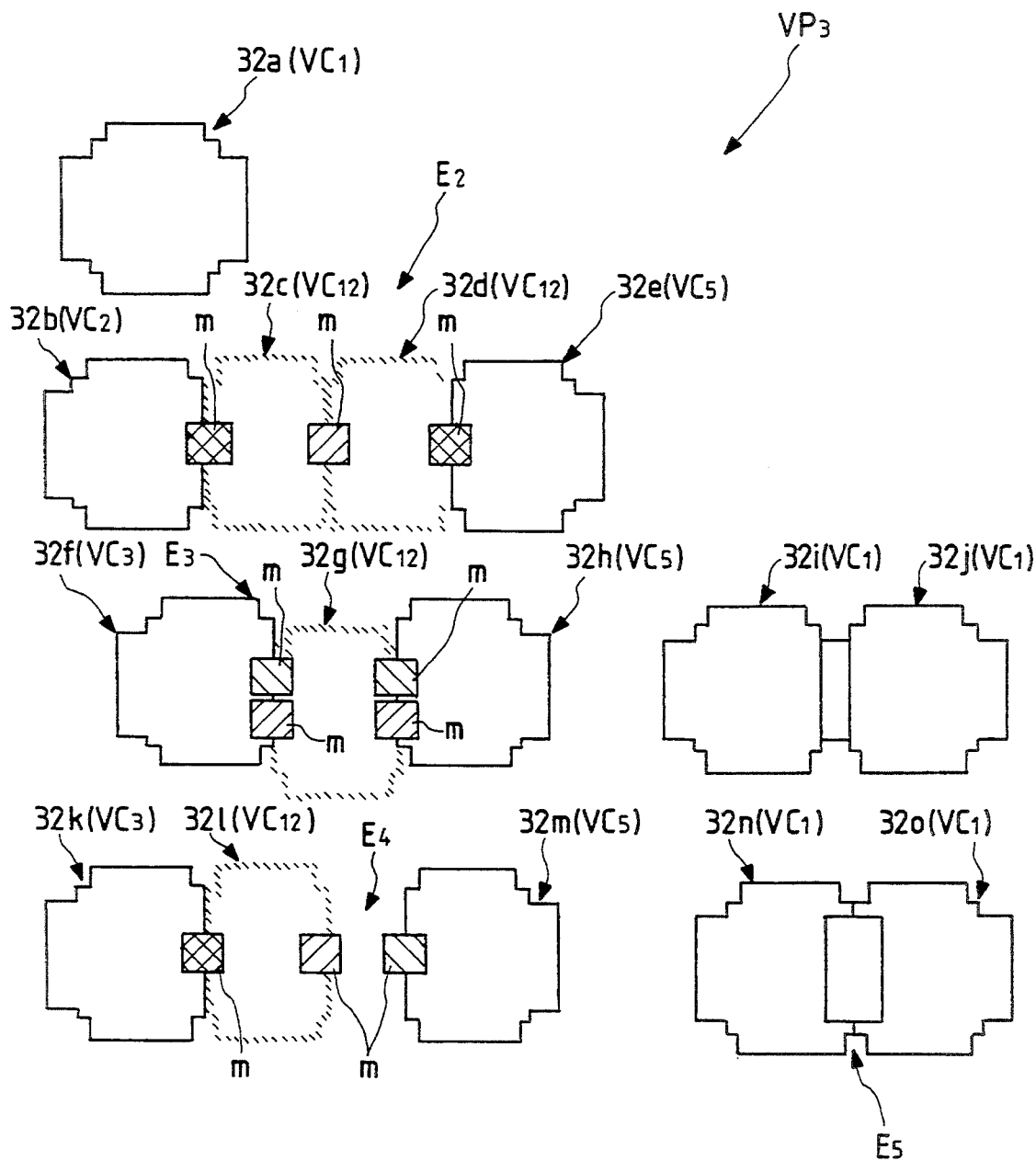
FIG. 25 is a top plan view showing a pattern which replaces the mask pattern of FIG. 20 by the verifying cells.

FIGS. 17 and 18 are flow charts for describing the step of verifying a mask pattern of a phase shift mask according to another embodiment of the present invention; FIG. 19 is a top plan view showing a plurality of connection hole pattern cells to be used in a verifying step of the present embodiment 2; FIG. 20 is a top plan view showing an example of the mask pattern; FIG. 21 is a diagram for describing the step of separating a mask pattern; FIG. 22 is a diagram for describing the step of extracting isolated patterns; FIG. 28 is a top plan view showing verifying cells made by using the connection hole cells of FIG. 19; FIG. 24 is a diagram for describing the method making the verifying cells of FIG. 23; FIG. 25 is a top plan view showing a pattern which replaces the mask pattern of FIG. 20 by the verifying cells; and FIG. 26 is a top plan view showing a pattern from which overlapped ones of adjacent verifying cells are extracted.

In the present embodiment 2, the method of making the data of a connection hole pattern by using the phase shifting method will be described in the following with reference to FIGS. 17 to 26.

Here, the hole pattern is a mask pattern which is formed over a mask substrate for transferring the pattern of connection holes for effecting connections both between different wiring layers in a semiconductor integrated circuit device and between a semiconductor wafer and the wiring layers, to a photoresist film applied to the semiconductor wafer.

Incidentally, in the layout of the hole patterns using the phase shifting method, the following first to ninth rules have to be observed, for example.

The first rule is as follows. Specifically, the size of real patterns forming the hole pattern has to conform to a designed value.

The second rule is as follows. Specifically, the size of auxiliary patterns forming the hole pattern has to conform to a designed value. Here, the auxiliary patterns are layout patterns for forming a pattern on a mask substrate, which is not transferred to the semiconductor wafer but is necessary for forming a predetermined pattern on the semiconductor wafer.

The third rule is as follows. Specifically, the longer sides of the auxiliary patterns have to face the sides of the real patterns.

The fourth rule is as follows. Specifically, there must not exist any isolated real pattern, isolated auxiliary pattern and isolated shifter pattern.

Here, the isolated real patterns are formed of the real patterns only but cannot transfer the hole pattern of desired diameter by themselves. The isolated auxiliary patterns are formed of the auxiliary patterns only but cannot transfer the hole patterns by themselves. Moreover, the isolated shifter patterns are formed of the shifter patterns only.

The fifth rule is as follows. Specifically, the real patterns and the corresponding auxiliary patterns must not be out of position relative to each other.

The sixth rule is as follows. Specifically, in case the individual real patterns composing different hole patterns are arranged at the minimum gap, they must not be out of position relative to each other.

The seventh rule is as follows. Specifically, the minimum gap between the real patterns and the auxiliary patterns have to conform to a designed value.

The eighth rule is as follows. Specifically, in the vicinity of the four sides of the real patterns, there must exist patterns having different phases of transmitted lights for the lights which have transmitted through the real patterns.

The ninth rule is as follows. Specifically, in case different real patterns are adjacent to each other, both the gap of these real patterns and the gap between the auxiliary patterns in case different hole patterns are adjacent to each other have conform to designed values.

In the present embodiment 2, therefore, the following process is taken to make the mask pattern data of the hole patterns satisfying the above-specified rules.

First of all, in the present embodiment 2, there are prepared hole pattern cells (as will be shortly referred to as the "hole cells") $C_1$ to $C_{14}$, as shown in FIG. 19.

The hole cell $C_1$ of FIG. 19 is constructed to include a square real pattern $T_1$ laid out at the center, square auxiliary patterns $A_1$ to $A_4$ arranged individually in the vicinity of the four sides of the real pattern $T_1$, and shifter patterns $S_1$ to $S_4$ arranged individually on the auxiliary patterns $A_1$ to $A_4$, as hatched.

The hole cell $C_2$ is constructed to include a square real pattern $T_2$ laid out at the center, a shifter pattern $S_5$ arranged on the real pattern $T_2$, as hatched, and auxiliary patterns $A_5$ to $A_8$ arranged individually in the vicinity of the four sides of the real pattern $T_2$.

The hole cell $C_3$ is constructed to include a square real pattern $T_3$ laid out at the center, square auxiliary patterns $A_9$ to $A_{11}$ arranged individually in the vicinity of the lefthand, upper and lower sides of the real pattern $T_3$, as shown in FIG. 19, and shifter patterns $S_6$ to $S_8$ arranged individually on the auxiliary patterns $A_9$ to $A_{11}$, as hatched.

The hole cell $C_4$ is constructed to include a square real pattern $T_4$ laid out at the center, a shifter pattern $S_9$ arranged on the real pattern $T_4$, as hatched, and square auxiliary patterns $A_{12}$ to $A_{14}$ arranged individually in the vicinity of the lefthand, upper and lower sides of the real pattern $T_4$, as shown in FIG. 19.

The hole cell $C_5$ is constructed to include a square real pattern $T_5$ laid out at the center, square auxiliary patterns $A_{15}$ to $A_{17}$ arranged individually in the vicinity of the righthand, upper and lower sides of the real pattern $T_5$, as shown in FIG. 19, and shifter patterns $S_{10}$ to $S_{12}$ arranged individually on the auxiliary patterns $A_{15}$ to $A_{17}$, as hatched.

The hole cell $C_6$ is constructed to include a square real pattern $T_6$ laid out at the center, a shifter pattern $S_{13}$ arranged on the real pattern $T_6$, as hatched, and square auxiliary patterns $A_{18}$ to $A_{20}$ arranged individually in the vicinity of the righthand, upper and lower sides of the real pattern $T_6$, as shown in FIG. 19.

The hole cell $C_7$ is constructed to include a square real pattern $T_7$ laid out at the center, square auxiliary patterns $A_{21}$ to $A_{23}$ arranged individually in the vicinity of the righthand, lefthand and lower sides of the real pattern $T_7$, as shown in FIG. 19, and shifter patterns $S_{14}$ to $S_{16}$ arranged individually on the auxiliary patterns $A_{21}$ to $A_{23}$, as hatched.

The hole cell $C_8$ is constructed to include a square real pattern $T_8$ laid out at the center, a shifter pattern $S_{17}$ arranged on the real pattern $T_8$, as hatched, and square auxiliary patterns $A_{24}$ to $A_{26}$ arranged individually in the vicinity of the righthand, lefthand and lower sides of the real pattern $T_8$, as shown in FIG. 19.

The hole cell $C_9$ is constructed to include a square real pattern $T_9$ laid out at the center, square auxiliary patterns $A_{27}$ to $A_{29}$ arranged individually in the vicinity of the righthand, lefthand and upper sides of the real pattern $T_9$, as shown in FIG. 19, and shifter patterns $S_{18}$ to $S_{20}$ arranged individually on the auxiliary patterns $A_{27}$ to $A_{29}$, as hatched.

The hole cell $C_{10}$ is constructed to include a square real pattern $T_{10}$ laid out at the center, a shifter pattern $S_{21}$ arranged on the real pattern $T_{10}$, as hatched, and square auxiliary patterns $A_{30}$ to $A_{32}$ arranged individually in the vicinity of the righthand, lefthand and upper sides of the real pattern $T_{10}$, as shown in FIG. 19.

The hole cell $C_{11}$ is constructed to include a square real pattern $T_{11}$ laid out at the center, square auxiliary patterns $A_{33}$ and $A_{34}$ arranged individually in the vicinity of the righthand and lefthand sides of the real pattern $T_{11}$, as shown in FIG. 19, and shifter patterns $S_{22}$ and $S_{23}$ arranged individually on the auxiliary patterns $A_{33}$ and $A_{34}$, as hatched.

The hole cell $C_{12}$ is constructed to include a square real pattern $T_{12}$ laid out at the center, a shifter pattern $S_{24}$ arranged on the real pattern $T_{12}$, as hatched, and square auxiliary patterns $A_{35}$ and $A_{36}$ arranged individually in the vicinity of the upper and lower sides of the real pattern $T_{12}$, as shown in FIG. 19.

The hole cell $C_{13}$ is constructed to include a square real pattern $T_{13}$ laid out at the center, square auxiliary patterns $A_{37}$ and $A_{38}$ arranged individually in the vicinity of the righthand and lefthand sides of the real pattern $T_{13}$, as shown in FIG. 19, and shifter patterns $S_{25}$ and $S_{26}$ arranged individually on the auxiliary patterns $A_{37}$ and $A_{38}$, as hatched.

The hole cell $C_{14}$ is constructed to include a square real pattern $T_{14}$ laid out at the center, a shifter pattern $S_{27}$ arranged on the real pattern $T_{14}$, as hatched, and square auxiliary patterns $A_{39}$ and $A_{40}$ arranged individually in the vicinity of the upper and lower sides of the real pattern $T_{14}$, as shown in FIG. 19.

Incidentally, the auxiliary patterns $A_1$ to $A_{14}$, the auxiliary patterns $A_1$ to $A_{40}$ and the shifter patterns $S_1$ to $S_{27}$ constructing the hole cells $C_1$ to $C_{14}$ are correctly set in respect of data such as sizes or positional relations.

Subsequently, Verification 1 of the present embodiment 2, as shown in FIG. 17, is performed, as follows. First of all, all the hole patterns using the phase shifting method are laid out (at Step 100) on the layout plane by using the aforementioned hole cells $C_1$ to $C_{14}$ to make the mask pattern MP, for example, as shown in FIG. 20. However, the individual hole patterns may be formed without the use of the hole cells $C_1$ to $C_{14}$.

The mask pattern MP has hole patterns 20a to 29o, an isolated auxiliary pattern 30, and an isolated real pattern 31.

The hole patterns 29a, 29i, 29j, 29n and 29o are laid out by using the hole cell $C_1$ of FIG. 19. The hole patterns 29b, 29f and 29k are laid out by using the hole cell $C_3$ of FIG. 19. The hole patterns 29c, 29d, 29g and 29l are laid out by using the hole cell $C_{12}$ of FIG. 19. The hole patterns 29e, 29h and 29m are laid out by using the hole cell $C_5$ of FIG. 19.

In FIG. 20, moreover, there are shown the following errors $E_1$ to $E_5$, for example, so as to describe the data verifying method of the mask pattern of the present embodiment 2.

The first error $E_1$ is that the isolated auxiliary pattern 30 and the isolated real pattern 31 exist.

The second error $E_2$ is that the hole patterns 29c and 29d, in which the lights to transmit therethrough are in phase, are arranged close to each other.

The third error $E_3$ is that the position of the hole pattern 29g is displaced downward of FIG. 20 from the positions of other hole patterns 29f and 29h.

The fourth error $E_4$ is that the hole patterns 29l and 29m are more distant from each other than a regulated gap.

The fifth error $E_5$ is that the hole patterns 29n and 29o are overlapped.

This mask pattern is separated into a real pattern data layer, an auxiliary pattern data layer and a shifter pattern data layer, as shown in FIG. 21.

The real pattern data layer has the real patterns $T_1$ to $T_{14}$ and 31 only. The auxiliary pattern data layer has the auxiliary patterns $A_1$ to $A_{40}$ and 30 only. The shifter pattern data layer has the shifter patterns $S_1$ to $S_{27}$ only.

The individual pattern data layers can be graphically processed not only Independently of one another but also among the pattern data layers, e.g., synthesized among the pattern data layers.

Subsequently, in Verification 1 of the present embodiment 2, as shown in FIG. 17, the hole patterns 29a to 29o of the mask pattern MP, which are formed by using the hole cells $C_1$ to $C_{14}$, are replaced (at Step 101) by vacant cells, as shown in FIG. 22.

Here, the vacant cells are cells having not any pattern but the information of the cell areas only. In the present embodiment 2, the vacant cells are cells having no information of the hole patterns. On the other hand, the cells are said the fundamental units of the patterns when the mask pattern is to be laid out and are constructed to include one or more layout pattern. The layout time for laying out a number of identical patterns can be shortened by defining the cells.

By this replacement, moreover, the patterns other than the hole cells, such as the isolated auxiliary pattern 30 or the isolated real pattern 31 can be extracted onto the layout plane to check the error $E_1$ (at Step 102).

However, hole patterns of large diameter not using the phase shifting method may exist in the mask pattern. In this case, by checking the diameters of the hole patterns after the aforementioned replacing Step 102, it can be decided which the hole patterns belong to the erroneous isolated real pattern or the correct real pattern. Thus, only the erroneous isolated real pattern can be extracted.

Next, Verification 2 of the present embodiment 2, as shown in FIG. 18, will be described along Steps 100 to 105 with reference to FIG. 20 and FIGS. 23 to 26.

First of all, in the present embodiment 2, prior to the verifying process, the hole cells $C_1$ to $C_{14}$ are used to make verifying cells $VC_1$ to $VC_{14}$, as shown in FIG. 23. These verifying cells $VC_1$ to $VC_{14}$ are the cells which are replaced by the hole cells $C_1$ to $C_{14}$ so as to verify the layout rules.

Those, as hatched, of the verifying cells $VC_1$ to $VC_{14}$ are the cells in which the shifter patterns are arranged in the real patterns of the hole cells $C_1$ to $C_{14}$.

On the other hand, square marks m attached to predetermined sides of the verifying cells indicate that no auxiliary pattern exists in any of the sides. And, those of the marked verifying cells $VC_3$ to $VC_{14}$, in which shifter patterns are arranged on the real patterns, are hatched leftward in the marks m, whereas those, in which the shifter patterns are arranged on the real patterns, are hatched rightward in the marks m.

These verifying cells $VC_1$ to $VC_{14}$ are made by synthesizing the thickened patterns of the real patterns and auxiliary patterns of the hole cells $C_1$ to $C_{14}$.

Here, by taking up the verifying cell $VC_1$ as an example, the method of making the verifying cells $VC_1$ to $VC_{14}$ will be described with reference to FIG. 24.

First of all, the real pattern $T_1$ and the auxiliary patterns $A_1$ to $A_4$ of the hole cell $C_1$ are separated. Subsequently, those real pattern $T_1$ and auxiliary patterns $A_1$ to $A_4$ are thickened to a predetermined extent to form patterns VT and VA, respectively.

The thickening extent of this case is set to decide the gap between the adjacent ones of the verifying cells $VC_1$ to $VC_{14}$.

In the present embodiment 2, the extent of thickening the real pattern $T_1$ is about one half of the minimum gap of the hole patterns, for example. On the other hand, the extent of thickening the auxiliary patterns $A_1$ to $A_4$ is about one half of the minimum gap of the auxiliary patterns, for example.

After this, the patterns VT and VA are synthesized in position to make the verifying cell $C_1$.

Next, in Verification 2 of the present embodiment 2, all the hole patterns using the phase shifting method are laid out (at Step 100 of FIG. 18) at first over the layout plane by using the aforementioned hole cells $C_1$ to $C_{14}$, to make the mask pattern MP, for example, as shown in FIG. 20.

Subsequently, the hole cells $C_1$ to $C_{14}$ of that mask pattern MP are replaced (at Step 101 of FIG. 18) by the aforementioned verifying cells $VC_1$ to $VC_{14}$, to make a third verifying pattern $VP_3$, as shown in FIG. 25. This third verifying pattern $VP_3$ has verifying cells 32*a* to 32*o*.

Subsequently, the positions and orders of arrangement of the verifying cells 32*a* and 32*o* are verified (at Step 102). Here, it is checked, for example, that all the marks m have their rightward hatched marks and leftward hatched marks overlapped, namely, that neither the isolated rightward hatched mark m nor the isolated leftward hatched mark m exists.

Since here is arranged one isolated leftward hatched mark m between the verifying cells 32*c* and 32*d*, it can be decided that the arrangement is erroneous, to find out the error $E_2$.

Since, in the verifying cells 32*f*, 32*g* and 32*h*, too, the isolated lefthand hatched marks m and the isolated rightward hatched marks m are arranged, it can be decided that the arrangement is erroneous, to find out the error $E_3$. In this case, moreover, it can be decided, from the relation among the block lines of the verifying cells 32*f*, 32*g* and 32*h* and the positional relation between the isolated rightward hatched marks m and the isolated leftward hatched marks m, that the position of the verifying cell 32*g* is offset downward from the positions of the verifying cells 32*f* and 32*h*.

Since, moreover, the isolated leftward hatched mark m and the isolated rightward hatched mark m are also arranged in the verifying cells 32*l* and 32*m*, it can be decided that the arrangement is erroneous to find out the error $E_4$. In this case, moreover, it can be decided from the positional relation between the isolated rightward hatched mark m and the isolated leftward hatched mark m that the verifying cell 32*l* and the verifying cell 32*m* are excessively distant from each other.

After this, of the verifying cells 32*a* to 32*o*, the overlapped verifying cells 32*i* and 32*j* and verifying cells 32*n* and 32*o* are extracted (at Step 103 of FIG. 18). A fourth verifying pattern $VP_4$ thus extracted is shown in FIG. 26. The hatching lines in the same Figure indicate the overlapping.

Here, it is correct if the verifying cells in solid lines and the verifying cells in broken lines of the verifying pattern $VP_4$ are individually overlapped, but it is erroneous if the verifying cells in solid lines and the verifying cells in broken lines are overlapped.

Subsequently, from the fourth verifying pattern $VP_4$, there is extracted (at Step 104 in FIG. 18) a pattern, in which only one auxiliary pattern is interposed between the real patterns, namely, a correct pattern, in which the isolated hole cells are arranged at the minimum gap so that they are overlapped if indicated by the verifying cells, such as the verifying cells 32*i* and 32*j* corresponding the hole cells 29*i* and 29*j*, for example, as shown in FIG. 20.

After this, the pattern extracted at Step 104 is eliminated from the fourth verifying pattern $VP_4$ extracted at Step 103. As a result, the verifying cells 32*n* and 32*o* overlapped erroneously can be extracted to find out the error $E_5$.

Thus, according to the present embodiment 2, the data of the mask pattern of the phase shift mask can be verified and corrected, when they are to be made, by performing the aforementioned Verifications 1 and 2 so that the data of the mask pattern of the correct phase shift mask can be made.

By transferring a predetermined pattern to the photoresist film on the surface of the semiconductor wafer by the us of that phase shift mask, moreover, it is posslble to fabricate a highly reliable semiconductor integrated circuit device which has fine hole patterns.

Although our invention has been specifically described hereinbefore in connection with the foregoing embodiments 1 and 2, but it should not be limited to those embodiments but can naturally be modified in various manners without departing from the gist thereof.

In the foregoing embodiment 2, for example, the extents of thickening the real patterns and the auxiliary patterns at the time of making the verifying cells from the hole cells are set to one half of the minimum gap of the hole patterns and one half of the minimum gap of the auxiliary patterns, respectively. However, the extents should not be limited to those values but may be made less than those to verity the gap of the verifying cells.

In the foregoing embodiments, moreover, the wiring patterns and the hole patterns are separated for the sake of description. For the mask pattern having the wiring patterns and the hole patterns using the phase shifting method, however, the data of the mask pattern can be checked by performing the different verifications of the embodiments 1 and 2 individually for the wiring patterns and the hole patterns.

In the description thus far made, our invention has been described mainly In case it is applied to the process of fabricating a semiconductor integrated circuit device backgrounding the field of application thereof. Despite of this description, however, the application should not be limited thereto but could be made various. For example, the present invention can be applied to a process of fabricating another phase shift mask such as a process of fabricating a photo mask or a phase shift mask to be used for transferring a predetermined pattern to a liquid crystal substrate.

The effects to be obtained by the representative of the invention disclosed herein will be briefly described in the following.

According to the foregoing means, the data of the mask pattern of the phase shift mask can be verified and corrected to make the data of the correct mask pattern of the phase shift mask.

By transferring a predetermined semiconductor integrated circuit pattern to a photoresist film on the surface of a semiconductor wafer by the use of the phase shift mask made by using the data of that correct mask pattern, moreover, it is possible to fabricate a highly reliable semiconductor integrated circuit device having a fine pattern.

What is claimed is:

1. A process comprising the steps of:
   (a) separating the data of a mask pattern of a phase shift mask having phase shift patterns into (1) a real pattern data layer having the data of real patterns and (2) a phase shift pattern data layer having the data of said phase shift patterns;
   (b) verifying the propriety of the data of the real patterns having said phase shift patterns arranged thereon, by using the data of said phase shift patterns;
   (c) making a shielding pattern drawing data and a phase shift pattern drawing data individually on the basis of the data of the real patterns and the data of said phase shift patterns;
   (d) forming shielding patterns on a mask substrate on the basis of said shielding pattern drawing data; and
   (e) forming said phase shift patterns on said mask substrate on the basis of said phase shift pattern drawing data.

2. A process according to claim 1, further comprising the step of (f) transferring a predetermined semiconductor integrated circuit pattern to a resist film on the surface of a semiconductor wafer by using said phase shift mask having said shielding patterns and said phase shift patterns.

3. A mask fabricated by a process according to claim 2.

4. A semiconductor integrated circuit device fabricated by a process according to claim 2.

5. A process for fabricating a phase shift mask on a mask substrate, comprising the steps of:
   (a) separating the data of a mask pattern of a phase shift mask having phase shift patterns into (1) a real pattern data layer having the data of real patterns and (2) a phase shift pattern data layer having the data of said phase shift patterns;
   (b) eliminating the real patterns having the phase shift patterns arranged thereon from the data of said mask pattern by using the data of said phase shift patterns, to make the data of real patterns having no phase shift pattern arranged thereon;
   (c) verifying the propriety of the data of the real patterns having none of said phase shift patterns;
   (d) making shielding patterns drawing data and a phase shift pattern drawing data individually on the basis of the data of the real patterns and the data of said phase shift patterns;
   (e) forming shielding patterns on said mask substrate on the basis of said shielding pattern drawing data; and
   (f) forming said phase shift patterns on said mask substrate on the basis of said phase shift pattern drawing data.

6. A process for fabricating a phase shift mask on a mask substrate, comprising the steps of:
   (a) separating the data of a mask pattern of a phase shift mask having phase shift patterns into (1) a real pattern data layer having the data of real patterns and (2) a phase shift pattern data layer having the data of said phase shift patterns;
   (b) eliminating the real patterns having the phase shift patterns arranged thereon from the data of said mask pattern by using the data of said phase shift patterns, to make the data of real patterns having no phase shift pattern arranged thereon;
   (c) verifying the propriety of the data of the real patterns having none of said phase shift patterns;
   (d) verifying the propriety of the data of the real patterns having said phase shift patterns arranged thereon, by using the data of said phase shift patterns;
   (e) making a shielding pattern drawing data and a phase shift pattern drawing data individually on the basis of the data of the real patterns and the data of said phase shift patterns;
   (f) forming shielding patterns on said mask substrate on the basis of said shielding pattern drawing data; and
   (g) forming said phase shift patterns on said mask substrate on the basis of said phase shift pattern drawing data.

7. A process for fabricating a phase shift mask on a mask substrate, comprising the steps of:
   (a) separating the data of a mask pattern of a phase shift mask having phase shift patterns into (1) a real pattern data layer having the data of real patterns and (2) a phase shift pattern data layer having the data of said phase shift patterns;
   (b) eliminating the real patterns having the phase shift patterns arranged thereon from the data of said mask pattern by using the data of said phase shift patterns, to make the data of real patterns having no phase shift pattern arranged thereon;
   (c) verifying whether or not the gap between and the width of the real patterns having the phase shift patterns arranged thereon and the real patterns having none of said phase shift patterns are suited for regulated values, by using said phase shift patterns and said real patterns having no phase shift pattern;
   (d) making a shielding pattern drawing data and a phase shift pattern drawing data individually on the basis of the data of the real patterns and the data of said phase shift patterns;
   (e) forming shielding patterns on said mask substrate on the basis of said shielding pattern drawing data; and
   (f) forming said phase shift patterns on said mask substrate on the basis of said phase shift pattern drawing data.

8. A process for fabricating a phase shift mask on a mask substrate, comprising the steps of:
   (a) separating the data of a mask pattern of a phase shift mask having phase shift patterns into (1) a real pattern data layer having the data of real patterns and (2) a phase shift pattern data layer having the data of said phase shift patterns;
   (b) verifying whether or not said phase shift patterns are precisely coincident to the corresponding real patterns;
   (c) making a shielding pattern drawing data and a phase shift pattern drawing data individually on the basis of the data of the real patterns and the data of said phase shift patterns;
   (d) forming shielding patterns on said mask substrate on the basis of said shielding pattern drawing data; and
   (e) forming said phase shift patterns on said mask substrate on the basis of said phase shift pattern drawing data.

9. A process for fabricating a phase shift mask on a mask substrate, comprising the steps of:

(a) separating the data of a mask pattern of a phase shift mask having phase shift patterns into (1) a real pattern data layer having the data of real patterns, (2) an auxiliary pattern data layer having the data of auxiliary patterns, and (3) a phase shift pattern data layer having the data of said phase shift patterns;

(b) making data of hole patterns by using hole pattern cells prepared in advance;

(c) replacing the hole pattern cells for forming said hole patterns by vacant cells having no hole pattern data;

(d) verifying the existence and propriety of the patterns remaining after said replacing step;

(e) making a shielding pattern drawing data on the basis of the data of the real patterns and the data of said auxiliary patterns;

(f) making a phase shift pattern drawing data on the basis of the data of the phase shift patterns (g) forming shielding patterns on said mask substrate on the basis of said shielding pattern drawing data; and (h) forming said phase shift patterns on said mask substrate on the basis of said phase shift pattern drawing data.

10. A process for fabricating a phase shift mask on a mask substrate, comprising the steps of:

(a) separating the data of a mask pattern of a phase shift mask having phase shift patterns into (1) a real pattern data layer having the data of real patterns, (2) an auxiliary pattern data layer having the data of auxiliary patterns, and (3) a phase shift pattern data layer having the data of said phase shift patterns;

(b) making data of hole patterns by using hole pattern cells prepared in advance;

(c) replacing the hole pattern cells for forming said hole patterns by verifying cells;

(d) verifying the propriety of the relations among said verifying cells;

(e) making a shielding pattern drawing data on the basis of the data of the real patterns and the data of said auxiliary patterns;

(f) making a phase shift pattern drawing data on the basis of the data of the phase shift patterns;

(g) forming shielding patterns on said mask substrate on the basis of said shielding pattern drawing data; and (h) forming said phase shift patterns on said mask substrate on the basis of said phase shift pattern drawing data.

11. A process for fabricating a phase shift mask on a mask substrate, comprising the steps of:

(a) separating the data of a mask pattern of a phase shift mask having phase shift patterns into (1) a real pattern data layer having the data of real patterns, (2) an auxiliary pattern data layer having the data of auxiliary patterns, and (3) a phase shift pattern data layer having the data of said phase shift patterns;

(b) executing different verifications of the data of wiring patterns and the data of hole patterns of the data of said mask pattern;

(c) making a shielding pattern drawing data on the basis of the data o the real patterns and the data of said auxiliary patterns;

(d) making a phase shift pattern having data on the basis of the data of the phase shift patterns;

(e) forming shielding patterns on said mask substrate on the basis of said shielding pattern drawing data; and (f) forming said phase shift patterns on said mask substrate on the basis of said phase pattern drawing data.

12. A process for fabricating a phase shift mask on a mask substrate, comprising the steps of:

(a) separating the data of a mask pattern of a phase shift mask having phase shift patterns into (1) a real pattern data layer having the data of real patterns and (2) a phase shift pattern data layer having the data of said phase shift patterns;

(b) verifying whether or not the data of said mask pattern satisifies the regulation of the gap of in-phase patterns, in which individual lights transmitted through patterns adjacent to each other are in phase;

(c) making a shielding pattern drawing data and a phase shift pattern drawing data individually on the basis of the data of the real patterns and the data of said phase shift patterns;

(d) forming shielding patterns on said mask substrate on the basis of said shielding pattern drawing data; and (e) forming said phase shift patterns on said mask substrate on the basis of said phase shift pattern drawing data.

13. A process for fabricating a phase shift mask on a mask substrate, comprising the steps of:

(a) separating the data of a mask pattern of a phase shift mask having phase shift patterns into (1) a real pattern data layer having the data of real patterns and (2) a phase shift pattern data layer having the data of said phase shift patterns;

(b) verifying whether or not the data of said mask pattern satisfies the regulation of the width of in-phase patterns, in which individual lights transmitted through patterns adjacent to each other are in phase;

(c) making a shielding pattern drawing data and a phase shift pattern drawing data individually, on the basis of the data of the real patterns and the data of said phase shift patterns;

(d) forming shielding patterns on said mask substrate on the basis of said shielding pattern drawing data; and (e) forming said phase shift patterns on said mask substrate on the basis of said phase shift pattern drawing data.

14. A process for fabricating a phase shift mask on a mask substrate, comprising the steps of:

(a) separating the data of a mask pattern of a phase shift mask having phase shift patterns into (1) a real pattern data layer having the data of real patterns and (2) a phase shift pattern data layer having the data of said phase shift patterns;

(d) verifying whether or not the data of said mask pattern satisfies the regulation of the gap and width of in-phase patterns, in which individual lights transmitted through patterns adjacent to each other are in phase;

(c) making a shielding pattern drawing data and a phase shift pattern drawing data individually on the basis of the data of the real patterns and the data of said phase shift patterns;

(d) forming shielding patterns on said mask substrate on the basis of said shielding pattern drawing data; and (e) forming shielding patterns on said mask substrate on the basis of said shielding pattern drawing data.

15. A process for fabricating a phase shift mask on a mask substrate, comprising the steps of:

(a) separating the data of a mask pattern of a phase shift mask having phase shift patterns into (1) a real pattern data layer having the data of real patterns and (2) a phase shift pattern data layer having the data of said phase shift patterns;

(b) verifying whether or not the data of said mask pattern satisfies the regulation of the gap of in-phase patterns, in which individual lights transmitted through patterns adjacent to each other are in phase;

(c) making a shielding pattern drawing data and a phase shift pattern drawing data individually on the basis of the data of the real patterns and the data of said phase shift patterns;

(d) forming shielding patterns on said mask substrate on the basis of said shielding pattern drawing data; and (e) forming said phase shift patterns on said mask substrate on the basis of said phase shift pattern drawing data.

16. A mask fabricated by a mask fabricating process according to any of the claims 1, 5, 6, 7, 8, 9, 10, 11, 12, 13, 14 and 15.

17. A process according to any one of claims 1, 5, 6, 7, 8, 9, 10, 11, 12, 13, 14 and 15, including the further steps of correcting the data of the mask pattern, and repeating said verifying, after the verifying and before the making steps.

18. A process according to any one of claims 1, 5, 6, 7, 8, 9, 10, 11, 12, 13, 14 and 15, including a further step of initially providing a data of a mask pattern, having data of real patterns and data of phase shift patterns, prior to the separating step; and wherein the phase shift pattern drawing data and the shielding pattern drawing data are made on the basis of the data of the real and phase shift patterns formed at the step of initially providing the data of the mask pattern.

* * * * *